(12) United States Patent
Isaac et al.

(10) Patent No.: US 10,772,192 B2
(45) Date of Patent: Sep. 8, 2020

(54) BOARD-TO-BOARD CONTACTLESS CONNECTORS AND METHODS FOR THE ASSEMBLY THEREOF

(71) Applicant: Keyssa Systems, Inc., Campbell, CA (US)

(72) Inventors: Roger D. Isaac, San Jose, CA (US); Mostafa Naguib Abdulla, Rancho Cordova, CA (US)

(73) Assignee: KEYSSA SYSTEMS, INC., Campbell, CA (US)

( * ) Notice: Subject to any disclaimer, the term of this patent is extended or adjusted under 35 U.S.C. 154(b) by 361 days.

(21) Appl. No.: 15/145,589

(22) Filed: May 3, 2016

(65) Prior Publication Data

US 2017/0325328 A1    Nov. 9, 2017

(51) Int. Cl.
| | | |
|---|---|---|
| *H01P 5/02* | (2006.01) | |
| *H01P 11/00* | (2006.01) | |
| *H04B 5/00* | (2006.01) | |
| *H02J 50/90* | (2016.01) | |
| *H01F 38/14* | (2006.01) | |
| *G06F 1/16* | (2006.01) | |
| *G06F 13/42* | (2006.01) | |
| *G06F 3/14* | (2006.01) | |
| *G06F 13/00* | (2006.01) | |
| *H05K 1/18* | (2006.01) | |
| *H05K 1/02* | (2006.01) | |
| *H01L 21/48* | (2006.01) | |

(Continued)

(52) U.S. Cl.
CPC ....... *H05K 1/0237* (2013.01); *H01L 21/4817* (2013.01); *H01L 23/04* (2013.01); *H01L 23/3128* (2013.01); *H01L 23/3135* (2013.01); *H01L 23/66* (2013.01); *H01L 24/17* (2013.01); *H01L 24/48* (2013.01); *H01L 24/73* (2013.01); *H01L 25/16* (2013.01); *H04B 1/03* (2013.01); *H04B 1/08* (2013.01); *H05K 1/0296* (2013.01); *H05K 1/14* (2013.01); *H05K 1/181* (2013.01); *H05K 3/368* (2013.01); *H01L 2223/6677* (2013.01); *H01L 2224/16113* (2013.01); *H01L 2224/16225* (2013.01); *H01L 2224/48091* (2013.01); *H01L 2224/48106* (2013.01); *H01L 2224/48108* (2013.01); *H01L 2224/48225* (2013.01); *H01L 2224/73257* (2013.01); *H05K 2201/042* (2013.01); *H05K 2201/10128* (2013.01); *H05K 2203/16* (2013.01); *H05K 2203/162* (2013.01)

(58) Field of Classification Search
CPC .... H05K 1/0243; H05K 1/144; H05K 1/0239; H05K 1/181; H05K 2201/10098; H05K 7/1492; G06F 13/00; G06F 13/42; G06F 1/1698
See application file for complete search history.

(56) References Cited

U.S. PATENT DOCUMENTS

2012/0290760 A1* 11/2012 McCormack ........ H04B 5/0037
710/303
2013/0070817 A1* 3/2013 McCormack ............ H04B 1/18
375/219

(Continued)

*Primary Examiner* — Jayprakash N Gandhi
*Assistant Examiner* — Michael A Matey
(74) *Attorney, Agent, or Firm* — Van Court & Aldridge LLP

(57) ABSTRACT

The present disclosure relates to extremely high frequency ("EHF") systems and methods for the use thereof, and more particularly to board-to-board connections using contactless connectors.

16 Claims, 18 Drawing Sheets

(51) Int. Cl.
  *H01L 23/04*  (2006.01)
  *H01L 23/31*  (2006.01)
  *H01L 23/66*  (2006.01)
  *H01L 23/00*  (2006.01)
  *H01L 25/16*  (2006.01)
  *H04B 1/03*   (2006.01)
  *H04B 1/08*   (2006.01)
  *H05K 1/14*   (2006.01)
  *H05K 3/36*   (2006.01)

(56) References Cited

U.S. PATENT DOCUMENTS

| | | | | |
|---|---|---|---|---|
| 2013/0183898 A1* | 7/2013 | Strid | .................... | H04B 5/0037 455/41.1 |
| 2013/0193003 A1* | 8/2013 | Reed | ................. | B01L 3/502707 205/775 |
| 2013/0257670 A1* | 10/2013 | Sovero | .................... | H01Q 1/24 343/833 |
| 2013/0271331 A1* | 10/2013 | Redd | .................... | H01Q 19/062 343/753 |
| 2013/0328641 A1* | 12/2013 | Komori | .................... | H01P 3/00 333/137 |
| 2014/0043745 A1* | 2/2014 | McCormack | ........... | G06F 13/00 361/679.09 |
| 2015/0085903 A1* | 3/2015 | Gundel | ................ | H05K 1/0239 375/219 |
| 2015/0111496 A1* | 4/2015 | McCormack | ........ | H04B 5/0031 455/41.1 |
| 2015/0280827 A1* | 10/2015 | Adiletta | .................. | H01P 3/10 398/116 |
| 2015/0288410 A1* | 10/2015 | Adiletta | .................. | H04B 1/40 455/73 |
| 2017/0040660 A1 | 2/2017 | Gondi et al. | | |
| 2017/0300279 A1* | 10/2017 | McCormack | ........... | G06F 13/00 |

* cited by examiner

BOARD-TO-BOARD CONTACTLESS CONNECTORS AND METHODS FOR THE ASSEMBLY THEREOF

FIELD OF THE INVENTION

The present disclosure relates to extremely high frequency ("EHF") systems and methods for the use thereof, and more particularly to board-to-board connections using contactless connectors.

BACKGROUND

Electronic devices typically include an assembly of parts are that are electrically connected together to enable the flow of data, power, and signals between the various parts. These parts may be connected together using flexible cable connectors, mechanical interfacing board-to-board connectors, and the like. These connectors, while suitable for their intended purpose, can suffer from various disadvantages. For example, mechanical board-to-board connectors may require substantial board real estate and can have unacceptable Z heights. Flexible circuit connectors, for example, can suffer from robustness issues and can present assembly difficulties, particularly the need for human operators to ensure flex circuit board connections are precisely made. Accordingly, what are needed are robust connectors that are minimally invasive of real-estate and that facilitate ease of manufacturing.

BRIEF SUMMARY

Embodiments discussed herein refer to systems, methods, and circuits for establishing contactless substrate-to-substrate connections for contactlessly transmitting data between substrates. The contactless connections may serve as an alternative to conventional mechanical board-to-board and board-to-component connectors. The link may be a low-latency protocol-transparent communication link capable of supporting a range of data rates. The link may be established through a close proximity coupling between contactless communication units (CCUs). The coupled pairs of CCU can transmit data over a contactless link, thus negating a need for a wired connection (for data transfer). The use of CCUs can result in assemblies that are more robust and more compact than those using conventional connections, and can also simplify manufacturing line processes, thereby resulting in higher yields and faster throughput.

In one embodiment, a device can include a first circuit board having a first contactless communications unit (CCU) mounted to a first surface of the first circuit board, and a second circuit board comprising a second CCU mounted to a second surface of the second circuit board. The second circuit board is positioned below the first circuit board such that the first and second surfaces face each other and that a contactless board-to-board connection is established via the first and second CCUs. The device can include a conduit structure mounted to the first and second circuit boards, wherein the conduit structure comprises a EHF channel for directing contactless signals being communicated between the first and second CCUs.

In one embodiment, the contactless board-to-board connection enables contactless transmission of data between the first and second CCUs.

In one embodiment, the device can include a plurality of post members that securely couple the first and second circuit boards in a fixed position with respect to each other.

In one embodiment, at least one of the post members comprises a conductor for conveying power between the first and second circuit boards.

In one embodiment, the device can include at least one conductor coupled between the first and second circuit boards. The conductor can be a leaf spring or a wire.

In one embodiment, each of the first and second CCUs includes a printed circuit board, a silicon die mounted to the printed circuit board, a transducer, and a collimating structure operative to correct for a phase shift associated with the transducer.

In one embodiment, the second circuit board includes a third CCU, and the device can include a component including a fourth CCU, wherein the third and fourth CCUs form a contactless board-to-component connector for enabling contactless data transfer between the third and fourth CCUs.

In one embodiment, a gap separation between the first and second CCUs is controlled and wherein alignment axes associated with the first and second CCUs are substantially co-aligned.

In another embodiment, a system can include a housing, a power source, a component comprising a first contactless communications unit (CCU), and a circuit board having a second CCU. The first and second CCUs form a contactless connector that contactlessly communicates data between the component and the circuit board, wherein the power source is coupled to the circuit board. The system can also include a conductor that is coupled to the component and the circuit board, and wherein the conductor conveys power from the circuit board to the component.

In one embodiment, the component includes a third CCU, and wherein the circuit board includes a fourth CCU, wherein the third and fourth CCUs form another contactless connector that contactlessly communicates data between the component and the circuit board.

In one embodiment, the system includes a conduit structure coupled between the component and the circuit board, the conduit structure comprising at least two EHF channels for guiding EHF signal energy being transmitted via respective contactless connectors.

In one embodiment, the component is a display that is coupled to the housing.

In one embodiment, the first and second CCUS are constructed in a wafer lever fan out package format.

In one embodiment, each of the first and second CCUs includes a silicon die, a dielectric mounted to a first side of the silicon die, a transducer mounted to the dielectric, and a mold that encapsulates the silicon die, dielectric, and the transducer.

In one embodiment, each of the first and second CCUs includes a printed circuit board comprising a ground plane adjustment layer and a ground plane, a silicon die mounted on the printed circuit board, a transducer mounted on the printed circuit board, wherein the transducer is communicatively coupled to the silicon die, wherein the ground plane adjustment layer improves a radiation efficiency of the transducer by increasing a RF operating distance between the transducer and the ground plane beyond an actual physical distance between the transducer and the ground plane, and a mold that encapsulate the silicon die and the transducer.

In one embodiment, each of the first and second CCUs includes an aggregator, a controller chip coupled to the aggregator, and a transducer coupled to the controller chip.

In yet another embodiment, a method for assembling a device is provided. The method can include placing a first circuit board comprising a first contactless communications unit (CCU) into a device housing, securing the first circuit board to the device housing, mounting a conduit structure to the first circuit board, wherein the conduit structure comprises an EHF channel for guiding contactless signals being communicated between CCUs, aligning a second circuit board comprising a second CCU with respect to the first circuit board such that the second CCU is positioned within predefined alignment parameters of the first CCU to establish a contactless board-to-board connection between the first and second CCUs, and securing the first and second circuit boards in a fixed position with respect to each other after the second circuit board is aligned with the first circuit board, wherein the conduit structure is secured to the second circuit board when the first and second circuit boards are secured in the fixed position.

In one embodiment, the contactless board-to-board connection enables contactless transmission of data between the first and second CCUs.

In one embodiment, the predefined alignment parameters comprise gap separation between the first and second CCUs.

In one embodiment, the predefined alignment parameters comprise co-alignment of contactless signal pathways.

In one embodiment, the first circuit board is aligned with respect to the device using at least one alignment mechanism.

In one embodiment, the securing includes using post members to secure the first and second circuit boards together.

In one embodiment, the method further includes securing a power conductor to the first and second circuit boards.

In one embodiment, the method further includes placing a third CCU to the second circuit board, securing a second conduit structure to a side of the second circuit board, aligning a third circuit board within the device housing using at least one alignment mechanism, wherein the third circuit board comprises a fourth CCU, and securing the third circuit board to one of the second circuit board and the device housing such that the conduit structure is coupled to the third circuit board and provides an EHF pathway that exists between the third and fourth CCUs.

In one embodiment, the second circuit board comprises a third CCU, the method further includes aligning a component comprising a fourth CCU with respect to the second circuit board such that the fourth CCU is positioned within predefined alignment parameters of the third CCU to establish a contactless board-to-board connection between the third and fourth CCUs, and securing the component and second circuit board in a fixed position with respect to each other after the component is aligned with the second circuit board.

In another embodiment, a method for replacing physical interfacing connectors that convey data in board-to-board or board-to-component connections with contactless connectors is provided. The method can include securing a first substrate with respect to a second substrate, wherein the first substrate comprises a first contactless communications unit (CCU) and the second substrate comprises a second CCU, and establishing a contactless substrate-to-substrate connection via the first and second CCUs, wherein data is contactlessly communicated between the first and second substrates using the contactless substrate-to-substrate connection.

In one embodiment, the method further includes mounting a conductor to the first and second substrates to enable power conveyance.

In one embodiment, the securing includes aligning the first substrate with the second substrate such that the first and second CCUs are aligned to establish the contactless substrate-to-substrate connection.

In one embodiment, the first and second CCUs each comprise self-test circuitry, wherein the establishing comprises verifying that the first and second CCUs pass test administered by their respective self-test circuitry.

In another embodiment, a wafer lever fan out (WLFO) contactless communications unit (CCU) package is provided. The WLFO CCU package can include an integrated circuit, a transducer coupled to the integrated circuit, a mold that encapsulates the integrated circuit and the transducer, a redistribution layer coupled to the integrated circuit, and solder bumps coupled to the redistribution layer.

In one embodiment, the transducer is operative to contactlessly transmit and/or receive data.

In one embodiment, the transducer is constructed to emit EHF radiation in a polar phase.

In one embodiment, the the transducer is constructed to emit EHF radiation 90 degrees out of phase.

In one embodiment, the transducer is constructed to emit EHF radiation 180 degrees out of phase.

In one embodiment, the package includes a ground plane positioned adjacent to the transducer, wherein the ground plane is encapsulated by the mold.

In another embodiment, a CCU package can include a silicon die having a front and back, a dielectric layer disposed on the back of the silicon die, a metal layer disposed on top of the dielectric layer, and at least one interconnect coupled to the front of the silicon die and the metal layer, wherein the dielectric layer and metal layer form a transducer for contactlessly communicating contactless signals.

In one embodiment, the metal layer is a patch antenna.

In one embodiment, the metal layer covers an entirety of the dielectric layer.

In one embodiment, the metal layer covers a portion less than an entirety of the dielectric layer.

In one embodiment, the silicon die serves as a ground plane for the transducer.

In one embodiment, the dielectric layer comprises a ground plane adjustment layer.

In one embodiment, the package further includes a collimating structure operative to correct a phase shift associated with the transducer. The collimating structure cab be mounted directly on top of the metal layer.

In one embodiment, the package further includes a mold that encapsulates the metal layer, dielectric, and silicon die, wherein the collimating structure is mounted on top of the mold.

In one embodiment, the package further includes a printed circuit, wherein the front side of the silicon die is coupled to the printed circuit board.

In another embodiment, a CCU package can include a printed circuit board comprising a ground plane and a ground plane adjustment layer, a silicon die mounted to the printed circuit board, a transducer mounted to the printed circuit board, wherein the transducer is operative to contactlessly communicate contactless signals, at least one interconnect coupling the silicon die to the transducer, a collimating structure disposed above the transducer, the collimating structure operative to correct a phase shift associated with the transducer, and a mold that encapsulates at least the transducer and the silicon die.

In another embodiment, a silicon package for use in establishing contactless substrate-to-substrate connections is provided. The silicon package can include aggregator circuitry comprising at least two non-aggregated differential signal lanes and one aggregated differential signal lane, wherein the at least two non-aggregated differential signal lanes can be connected to a substrate, and a contactless communications unit (CCU) coupled to the aggregated differential signal lanes. The aggregator circuitry can be operative to mux signals received from the substrate prior to conveying signals to the CCU, and demux signals received from the CCU prior to conveying signals to the substrate.

In one embodiment, the aggregator circuitry enables use of a single lane D-Phy.

In one embodiment, the aggregator circuitry enables low speed contactless substrate-to-substrate connections.

In one embodiment, the aggregator circuitry accommodates a signal conveyance paradigm selected from the group consisting of D-Phy, ICC, SPI, GPIO, Aux, and SMBus.

A further understanding of the nature and advantages of the embodiments discussed herein may be realized by reference to the remaining portions of the specification and the drawings.

DETAILED DESCRIPTION

Figure 1A:
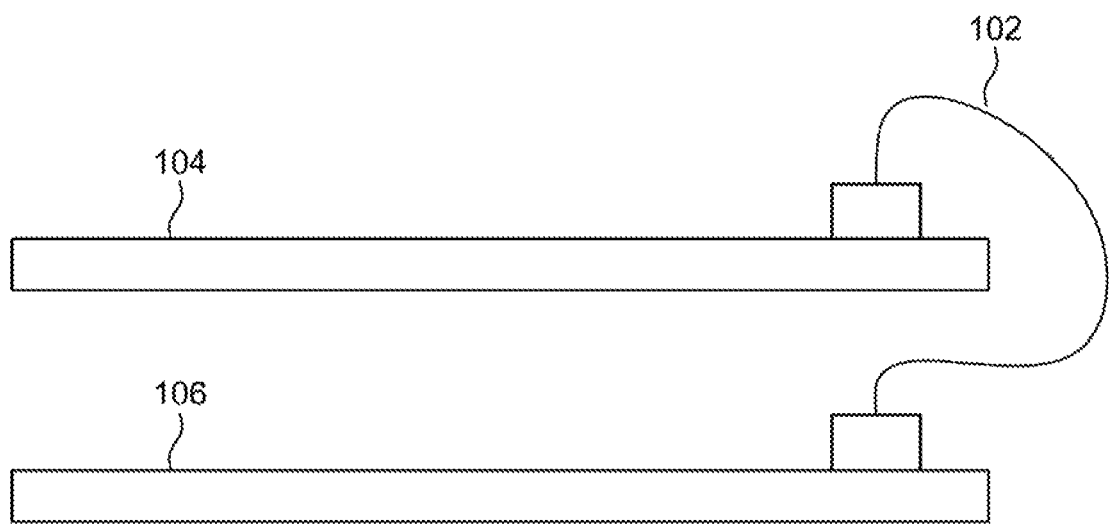
FIGS. 1A and 1B show conventional mechanical connectors for connecting boards.

Illustrative embodiments are now described more fully hereinafter with reference to the accompanying drawings, in which representative examples are shown. Indeed, the disclosed communication system and method may be embodied in many different forms and should not be construed as limited to the embodiments set forth herein. Like numbers refer to like elements throughout.

In the following detailed description, for purposes of explanation, numerous specific details are set forth to provide a thorough understanding of the various embodiments. Those of ordinary skill in the art will realize that these various embodiments are illustrative only and are not intended to be limiting in any way. Other embodiments will readily suggest themselves to such skilled persons having the benefit of this disclosure.

In addition, for clarity purposes, not all of the routine features of the embodiments described herein are shown or described. One of ordinary skill in the art would readily appreciate that in the development of any such actual embodiment, numerous embodiment-specific decisions may be required to achieve specific design objectives. These design objectives will vary from one embodiment to another and from one developer to another. Moreover, it will be appreciated that such a development effort might be complex and time-consuming but would nevertheless be a routine engineering undertaking for those of ordinary skill in the art having the benefit of this disclosure.

In today's society and ubiquitous computing environment, high-bandwidth modular and portable electronic devices are being used increasingly. Security and stability of communication between and within these devices is important to their operation. In order to provide improved secure high-bandwidth communications, the unique capabilities of wireless communication between electronic devices and between sub-circuits within each device may be utilized in innovative and useful arrangements.

Such communication may occur between radio frequency communication units, and communication at very close distances may be achieved using EHF frequencies (typically, 30-300 GHz) in an EHF communication unit. An example of an EHF communications unit is an EHF comm-link chip. Throughout this disclosure, the terms comm-link chip, and comm-link chip package are used to refer to EHF antennas embedded in IC packages. Comm-link chips are an example of a communication component, also referred to as contactless communication unit, a CCU or EHF transceiver (EHF XCVR).

The term "transceiver" may refer to a component such as an IC (integrated circuit) including a transmitter (Tx) and a receiver (Rx) so that the integrated circuit may be used to both transmit and receive information, such as data. Such a transceiver may be referred to herein as a contactless communications unit (CCU) or an EHF XCVR. Generally, a transceiver may be operable in a half-duplex mode (alternating between transmitting and receiving), a full-duplex mode (transmitting and receiving simultaneously), or configured as either a transmitter or a receiver. A transceiver may include separate integrated circuits for transmit and receive functions. The terms "contactless," "coupled pair," and "close proximity coupling" as used herein, refer to the implementing electromagnetic rather than electrical (wired, contact-based) connections and transport of signals between entities, such as electronic devices. As used herein, the term "contactless" may refer to a carrier-assisted, dielectric coupling system. The connection may be validated by proximity of CCUs contained in different. Multiple contactless transmitters and receivers may occupy a small space. A contactless link established with electromagnetics may be point-to point in contrast with a wireless link which typically broadcasts to several points.

The RF energy output by the EHF transceivers described herein may be designed to adhere to various requirements mandated by one or more governments or their agencies. For example, the FCC may promulgate requirements for certification for transmitting data in a RF frequency band.

"Standards" and related terms such as "Standards-based", "Standards-based interfaces", "Standards-based protocol", "interface protocols," and the like may refer to legacy interface standards which may include but are not limited to USB (e.g., USB 2, USB 3, USB 3/2, or USB OTG), DisplayPort (DP), Thunderbolt, HDMI, SATA/SAS, PCIe, Ethernet SGMII, Hypertransport, Quickpath, I2S, GPIO, I2C and their extensions or revisions. For example, the term "interface protocol" may refer to the protocol being used by one system to communicate with another system. As a specific example, the interface protocol being used by a system may be a USB interface protocol; as such, the system may communicate according to the rules governing USB communications.

FIG. 1A shows a conventional flexible circuit board connector 102 that connects board 104 to board 106. Flexible circuit board connector 102 can be a flex circuit or a rigid-flex circuit that can be bent and contorted for any number of different applications. Connector 102 can include conductive traces that are laminated with a flexible plastic substrate. The traces can be exposed on one or both ends of the substrate so that they can interface with an electrical connection, which may exist on board 104 or board 106. The assembly step of inserting flex connector 102 into a connector is typically performed by a human operator because robots lack the finesse required to make delicate flex to connector couplings. As a result, the human operating can be bottleneck in production throughput.

Figure 1B:
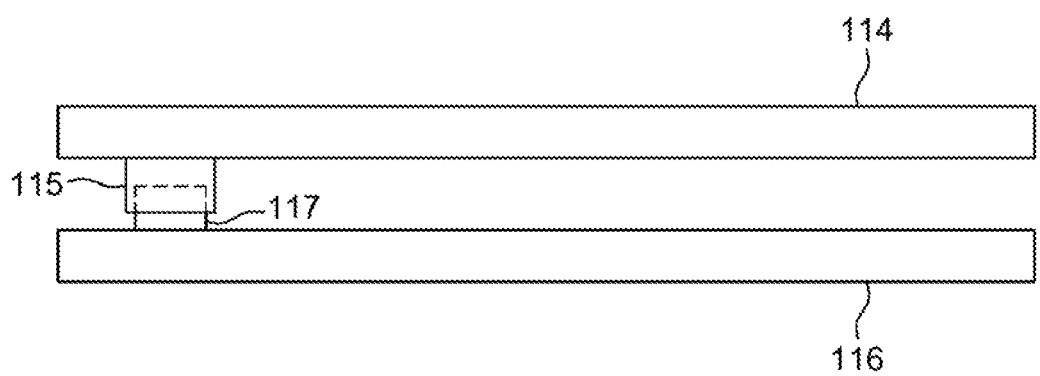

FIG. 1B shows conventional mechanical board-to-board connectors. FIG. 1B shows boards 114 and 116 coupled together via their respective mechanical connectors 115 and 117. Conventional mechanical connectors can wear out over time, require precise alignment and manufacturing methods, and can be susceptible to mechanical jostling. In addition, conventional mechanical connectors are bulky in comparison to other components typically found mounted on a circuit board, thus adding significant bulk to the overall dimensions of the device.

Figure 2:
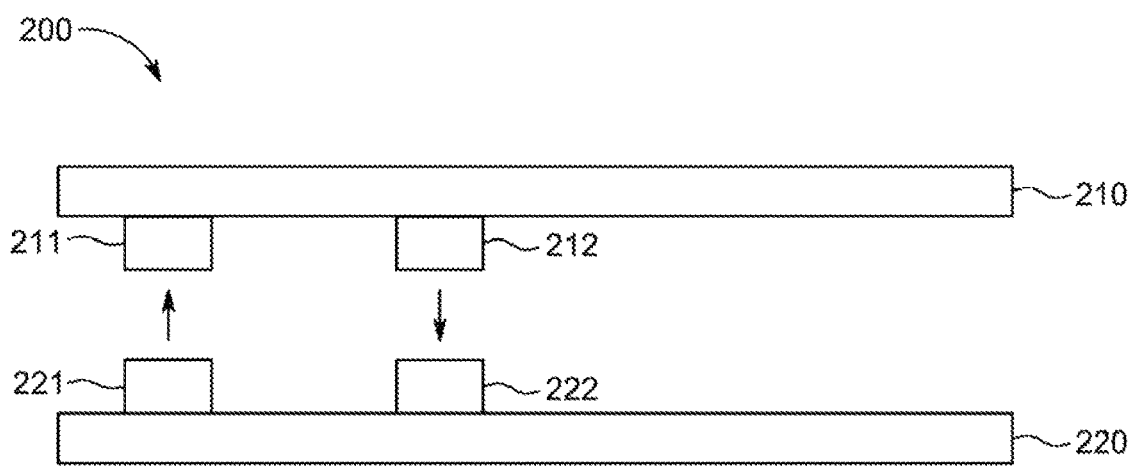
FIG. 2 shows an illustrative assembly of sub-assemblies using contactless communication units to communicate data with each other, according to an embodiment.

FIG. 2 shows an illustrative assembly 200 of sub-assemblies 210 and 220 using contactless communication units (CCUs) 211, 212, 221, and 222 to communicate data with each other, according to an embodiment. Sub-assemblies 210 and 220 can be any suitable component used in construction of electronic devices. For example, sub-assemblies 210 and 220 can be circuit boards such as printed circuit boards or flex circuit boards, or components such as a display screen, input mechanism, battery, volatile memory, non-volatile memory, camera, graphics circuitry, audio circuitry, or touch interface. CCUs 211 and 212 may be mounted to sub-assembly 210 and CCUs 221 and 222 may be mounted to sub-assembly 220. In the embodiment shown in FIG. 2, CCU 221 may contactlessly transmit data to CCU 211, and CCU 212 may contactlessly transmit data to CCU 222. Other CCU arrangements and/or configurations may be used. For example, only one pair of CCUs may be used, or more than two pairs of CCUs may be used.

The coupled pair arrangements of CCUs 211 and 221 and CCUs 212 and 222 can be used as replacement connectors for conventional board-to-board, board-to-component, or component-to-component connections. That is, in lieu of conventional connectors that use a mechanical interface to transmit data, the coupled pairs of CCU can transmit data over a contactless link, thus negating a need for a wired connection (for data transfer). The use of CCUs to contactlessly communicate data presents design and manufacturing issues not present with conventional connections, but the advantages of using CCUs can result in assemblies that are more robust and more compact than those using conventional connections, and can also simplify manufacturing line processes, thereby resulting in higher yields and faster throughput.

The absence of wired connections can advantageously eliminate the issues described above in connection with FIGS. 1A and 1B. However, connections using CCUs typically have to account for cross-talk, signal strength and attenuation, undesired signal radiation, and other potential issues. Embodiments discussed herein discuss how contactless connections address these potentials issues and further discuss how the mechanical connector environment lends itself to being an ideal environment for using CCUs. The environment of board-to-board connections provides a relatively high degree of control in terms of spacing between boards (and/or components), placement of the boards (and/or components) with respect to each other, and knowledge of materials being used. This control and knowledge can enable assembly manufacturers to confidently use contactless connections in place of conventional mechanical connectors.

Figure 3A:
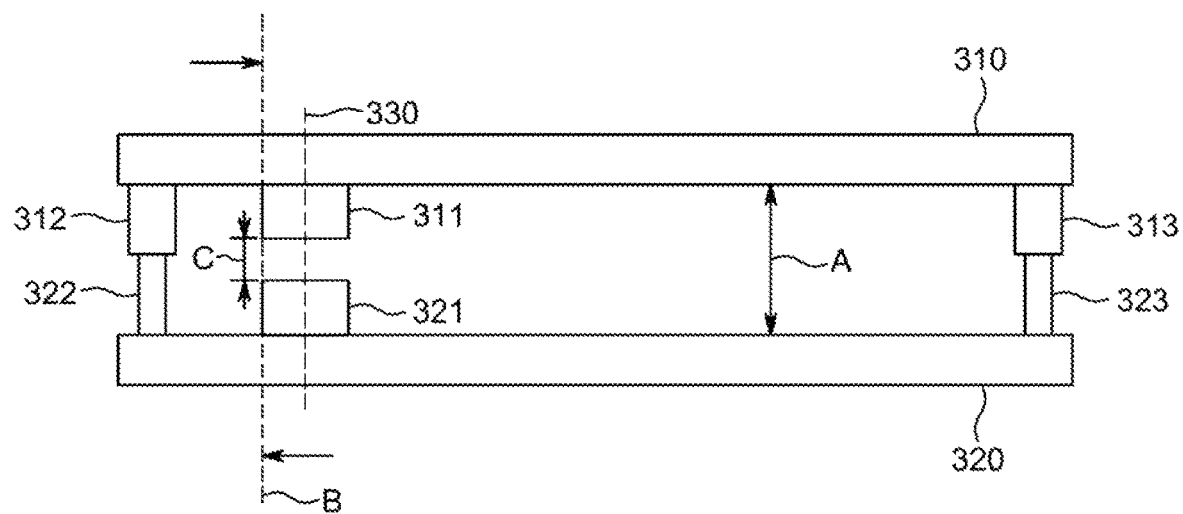
FIG. 3A shows illustrative cross-sectional view of an assembly, according to an embodiment.

FIG. 3A shows illustrative cross-sectional view of assembly 300 according to an embodiment. Assembly 300 can include board 310, CCU 311, posts 312 and 313, board 320, CCU 321, and posts 322 and 323, all arranged as shown. During assembly, board 310 may be aligned with board 320 using posts 312, 313, 322, and 323. Posts 312, 313, 322, and 323 may be any suitable structure that can secure and/or orient boards 310 and 320 a fixed distance, shown as A, apart from each other, and aligned with respect to each other such that CCUs 311 and 321 are positioned in an optimal contactless transmission path with respect to each other. For example, CCUs 311 and 321 may be in optimal contactless transmission path 330 when any two orthogonal edges of both CCUs are aligned. The cross-sectional view of FIG. 3A only shows alignment of one of those orthogonal edges, where any difference between those two edges is delineated by B. It should be understood that another view of assembly 300 (not shown) can show that the other orthogonal edges (e.g., the edges coming out of the page) are substantially aligned.

When boards 310 and 320 are coupled together via the posts, CCUs 311 and 321 may be aligned in accordance with optimal contactless transmission path 330 and positioned a fixed distance, C, apart from each other. The distance, C, may be controlled since the distance between a surface of board 310 and a surface of CCU 311 is known, and that the distance between a surface of board 320 and a surface of CCU 321 is also known. Thus, by controlling the distance, A, between boards 310 and 320, the distance, C, can be controlled. Controlling the distance, C, may provide the designer and/or assembly manufacturer with a controllable parameter for managing contactless signal energy being conveyed between CCUs 311 and 321. For example, the CCUs can be programmed to operate at lower RF energy levels in board-to-board replacement scenarios, as compared to device-to-device contactless connection scenarios. The RF energy level is dependent on the distance between the two CCUs and the target EM radiation required for a particular application. In some embodiments, the RF energy level can be set during training between pairs of CCUs, as the CCUs may negotiate the RF energy level required for operation in that application. In some embodiments, the CCUs may have a programmable interface that allows for optimization of the CCU for a given system or within the system.

Figure 3B:
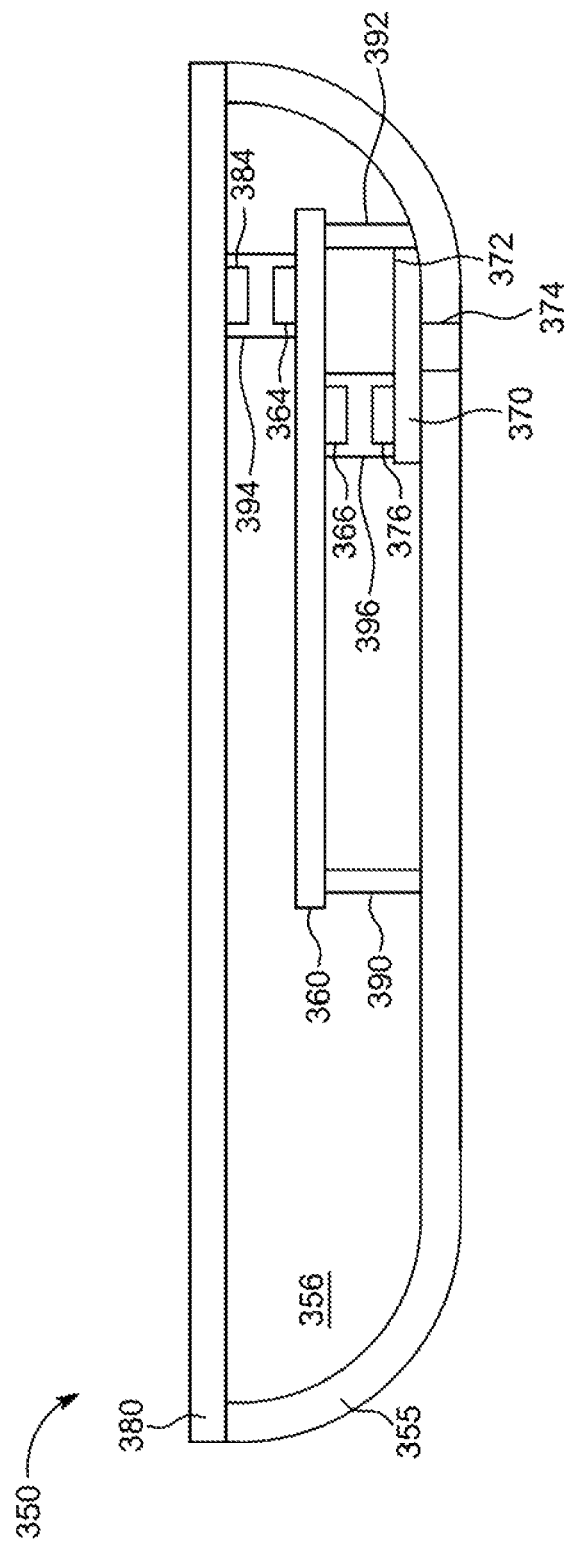
FIG. 3B shows illustrative cross-sectional view of another assembly, according to an embodiment.

FIG. 3B shows illustrative cross-sectional view of assembly 350 according to an embodiment. As shown, assembly 350 can include, among other components, housing 355, circuit board 360, camera 370, display 380, and posts 390 and 392. Housing 355 may be coupled to display 380 and can contain circuit board 360, camera 370, and post 390 and 392 within cavity 356. Camera 370 can include board 372, which can be electrically coupled to camera component 374 and CCU 376. Display 380 may include CCU 384. Circuit board 360 may be secured to posts 390 and 392, both of which are anchored to housing 355. Circuit board 360 may also include CCU 364, which is aligned with and facing CCU 384, and CCU 366, which is aligned with and facing CCU 376. Conduit structure 394 may exist between circuit boards 360 and 380, and positioned around CCUs 364 and 384. Conduit structure 396 may exist between circuit boards 360 and 370, positioned around CCUs 366 and 376. Conduit structures 394 and 396 may be designed to prevent EM radiation leakage outside of an intended path for the contactless signals being communicated between coupled pairs of CCUs. In addition, conduit structures 394 and 396 can reduce cross-talk between neighboring CCUs on the same board. Additional details of conduit structures are discussed below in connection with the description corresponding to FIG. 9. During construction of assembly 350, a pick and place machine can place conduit structure 396 on to board 370 such that it is positioned around CCU 376, and then when circuit board 360 is positioned in place, conduit structure 396 can surround CCU 366.

Posts 390 and 392 may secure circuit board 360 at a specific height with respect to camera 370 and display 380 such the appropriate distances (e.g., the A distance of FIG. 2) are maintained between coupled pairs of CCUs (e.g., coupled pair formed between CCUs 364 and 384, and coupled pair formed between CCUs 366 and 386). In addition, posts 390 and 392 can align circuit board in the correct orientation with respect to camera 370 and display 390 so that the optimal contactless signal pathways (not shown) are established between coupled pairs of CCUs. The ability to control alignment and gap separation for the coupled pairs of CCUs can enable assembly manufacturers to establish reliable data connections using CCUs. In addition, because mechanical connectors are effectively eliminated through use of the CCUs, entirely new manufacturing processes can be envisaged. These manufacturing processes can fully automated with virtually no human involvement.

It should be understood that the components shown and described in FIG. 3B are merely illustrative and that additional components may be placed therein and additional CCUs may be used to provide data transfer to and/or from those components. Moreover, as will be explained in more detail below, different approaches may be taken to route power from a power source (not shown) to a board (e.g., board 360) and/or components (e.g., camera 370 and display 380). Illustrative approaches are described in connection with the description accompanying FIGS. 6A-6C. Further still, different approaches may be taken to contain EHF signal energy being transmitted between coupled pairs, as described in connection with the description accompanying FIG. 9.

Figure 4:
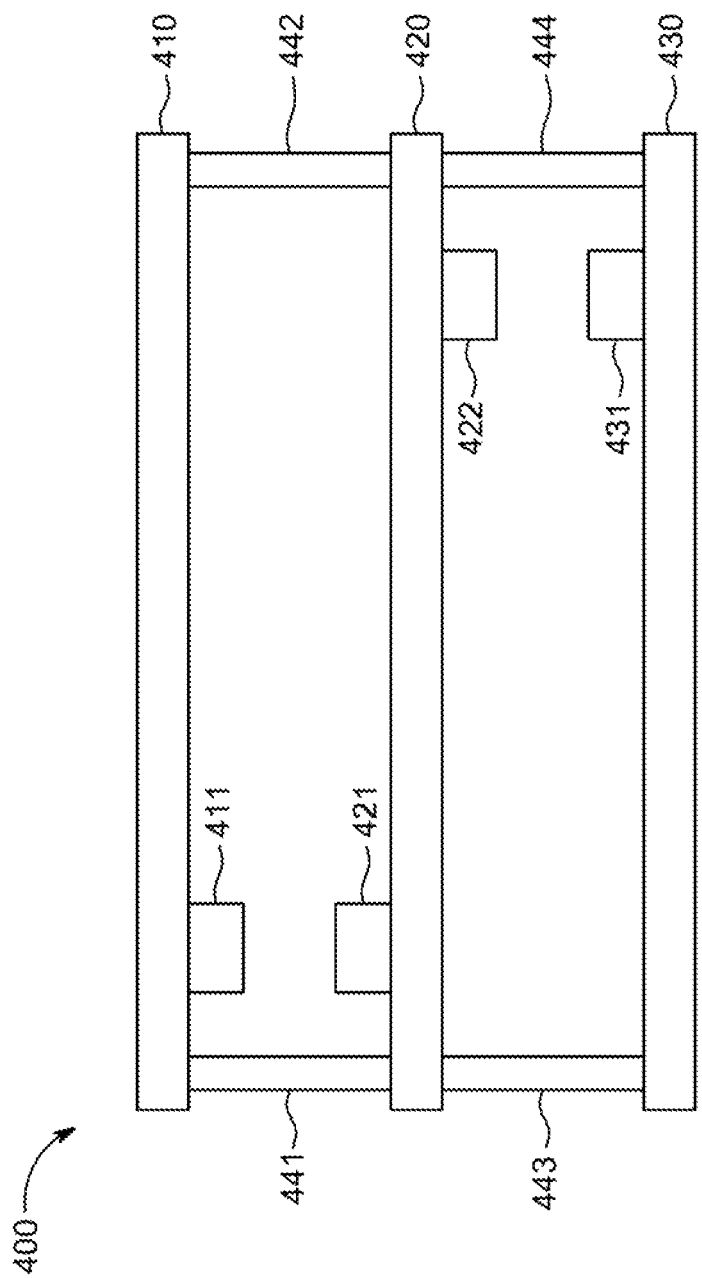
FIG. 4 shows an illustrative cross-sectional view of an assembly having multiple boards stacked on top of each other, according to an embodiment.

FIG. 4 shows an illustrative cross-sectional view of assembly 400 having multiple boards stacked on top of each other, according to an embodiment. As shown, assembly 400 has three boards stacked on top of each other. Boards 410 and 420 have respective CCUs 411 and 421 that communicate with each other, and boards 420 and 430 have respective CCUs 422 and 431 that communicate with each other. Post members 441 and 442 may control the gap separation and alignment of boards 410 and 420, whereas post members 443 and 444 may control the gap separation and alignment of boards 420 and 430. Assembly 400 benefits from the controlled alignment and gap separation as previously discussed in connection with assembly 300 (of FIG. 3). As a result, this gives designers and assembly line manufacturers extra degrees of control in managing contactless signal energy.

Figure 5:
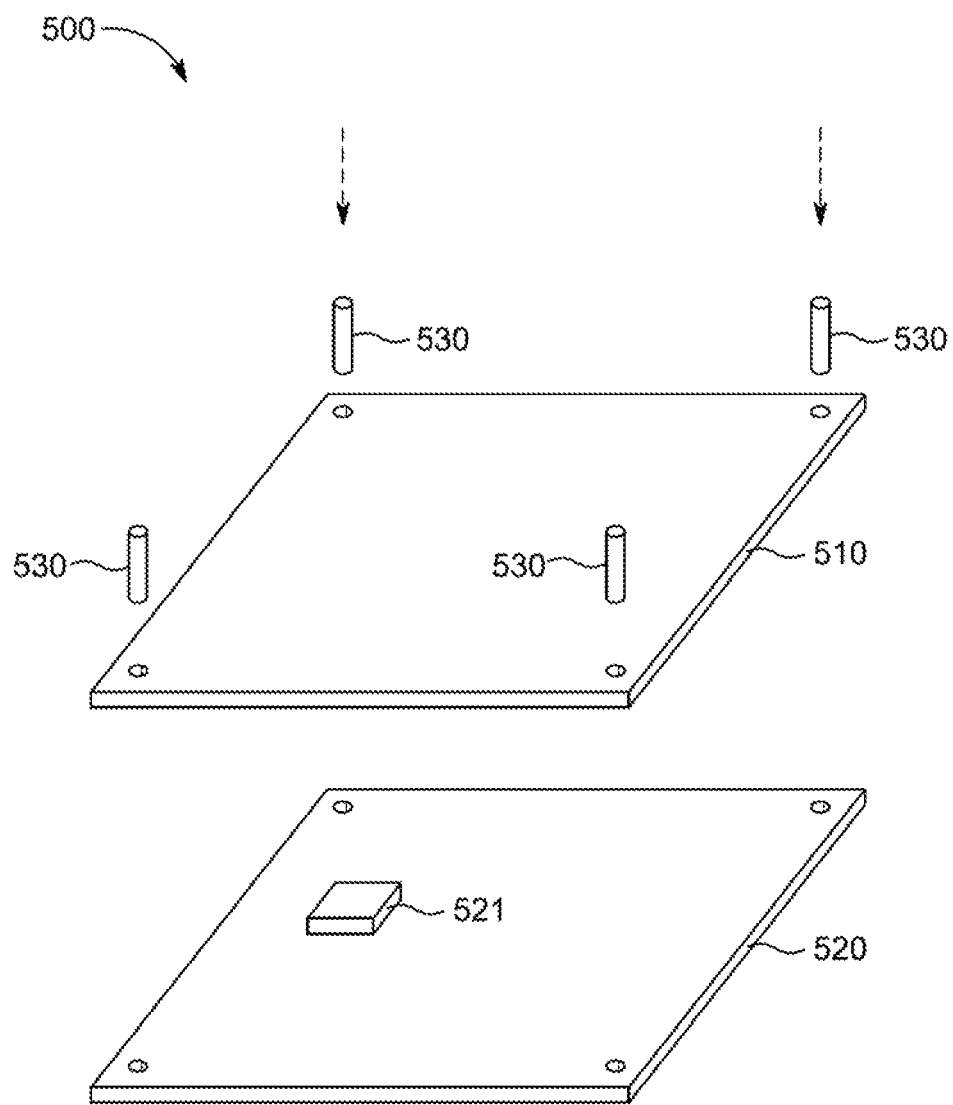
FIG. 5 shows an illustrative perspective view of an exploded assembly, according to an embodiment.

FIG. 5 shows an illustrative perspective view of an exploded assembly 500 including boards 510 and 520, CCU 521, and post members 530, according to an embodiment. A CCU attached to board 510 is not shown. In some embodiments, post members can be screws that secure one board to another. The construction of assembly 500 illustrates how post members 530 can be used to align boards 510 and 520 with respect to each other. During construction, post members 530 may be inserted into through-holes existing in boards 510 and 520. Post members 530 may have retention features (not shown) for being secured in place within the through-holes. With post members 530 secured to both boards 510 and 520, they can provide precise alignment of the boards, resulting in a correspondingly precise alignment of coupled pairs of CCUs existing opposite of each other in their respective boards. This results in precisely aligned contactless communications paths among coupled pairs of CCUs.

The use of CCUs in place of conventional board or component connectors, and the use of precise board-to-board alignment, can result in fully automated construction of assemblies such as those shown in FIGS. 3-5. Fully automated construction of such assemblies can be realized because there is no need for a human to physically connect a flex cable from one board to another board (or component), as the human component in an assembly line can be a bottleneck that hampers throughput of unit production. The board-to-board CCU connectors eliminate the need for the human component typically used to make conventional flex board connectors. Some assembly lines use pick and place robots that make flex connections, thereby eliminating the human component, but these pick and place robots often suffer from downtime caused by repeated device failure or need for replacement parts. The board-to-board CCU connectors according to embodiments herein are not hampered by the pick and place robot issues that plague conventional assembly lines.

The alignment of boards and/or components, as discussed above, provides consistent and controlled placement of CCUs, thereby ensuring that the contactless signal pathway existing among coupled pairs of CCUs are co-aligned. This alignment provides a foundation for incorporating other elements and/or structures or modifying existing structures such as CCU packaging that may be needed for fully implementing board-to-board CCU connectors according to embodiments discussed herein. These additional elements, structures, and modifications are now discussed.

Figure 6A:
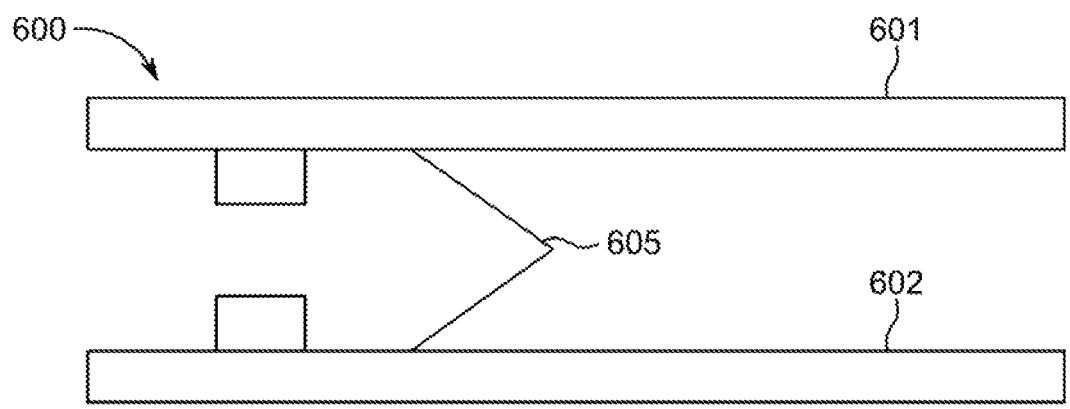
FIGS. 6A-6C show different power conveying structures that may be used in combination with the board-to-board CCU connector, according to various embodiments.
Figure 6B:
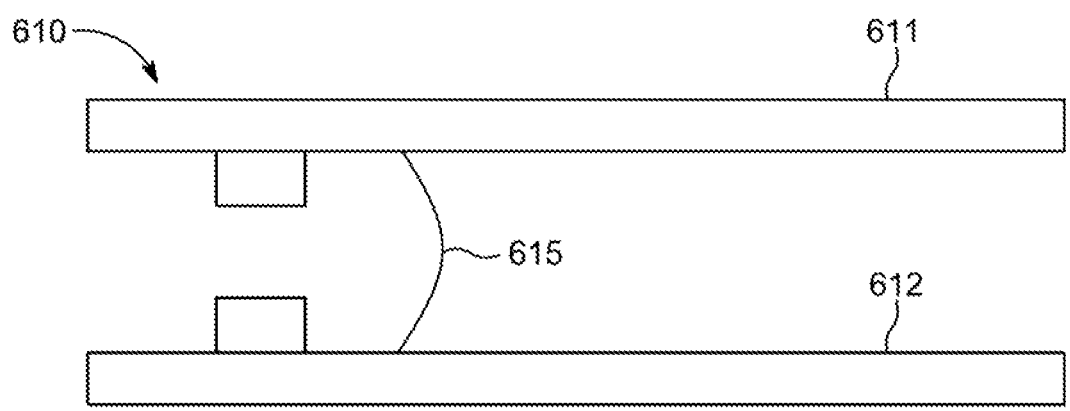
Figure 6C:
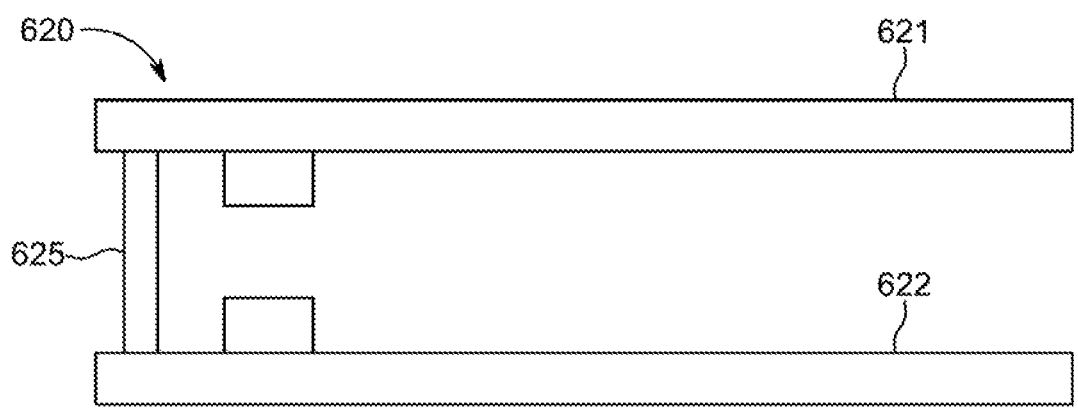

FIGS. 6A-6C show different power conveying structures that may be used in combination with the board-to-board CCU connector, according to various embodiments. The use of board-to-board CCU connector can effectively eliminate the need for a conventional wired connector, but there may be embodiments where power needs to be conveyed from one board/component to another board/component. FIG. 6A shows assembly 600 including leaf spring 605 coupled between boards 601 and 602. Leaf spring 605 may be soldered to one of boards 601 and 602 prior to assembly, and after the boards are mounted, the unsoldered portion of leaf spring 605 may form a spring biased connection with the other board. If desired, the unsoldered portion can be soldered.

FIG. 6B shows assembly 610 including wire 615 coupled between boards 611 and 612. In one approach, wire 615 can be soldered in place on both boards during construction of assembly 600. In another approach, a via can be drilled through board 611 and wire 615 can be inserted through the via so that it contacts with a contact pad (not shown) on board 612. After wire 615 is inserted, it can be soldered to both boards. In yet another approach, the wire can plug into a receptacle. Further still, in yet another approach, the wire can be screwed into place. FIG. 6C shows assembly 620 including post member 625 coupled between boards 621 and 622. Post member 625 may include one or more conductors that enable power to be conveyed between boards 621 and 622. It should be appreciated that although leaf spring 605, wire 615, and post member 625 are discussed in the context of providing power between boards and/or components, similar such structures may also be used for providing power ground and/or signal ground. For example, pogo pins may be used to provide power and/or ground.

Many electronic device manufacturers strive to make their products as thin as practically possible. This desire to decrease device thickness can place constraints on the board-to-board CCU connections that may require use of modified CCU silicon. For example, referring back to FIG. 3A, if the distance, A, between boards 310 and 320 is set to a distance to satisfy maximum thickness requirements of a device, the distance, C, may decrease to a point that that adversely affects the efficacy of the contactless connection between CCUs 311 and 321. That is, the distance, C, may fall below the minimum gap thickness required for optimal operation of the contactless connection. In such a situation, a wafer level fan out (WLFO) CCU may be used so that the Z-height of the CCU silicon package is reduced relative to a bonded wire CCU. The WLFO CCU can be a millimeter or more thin than a bonded wire CCU. As a result, the use of WLFO CCUs can increase the distance, C.

Figure 7A:
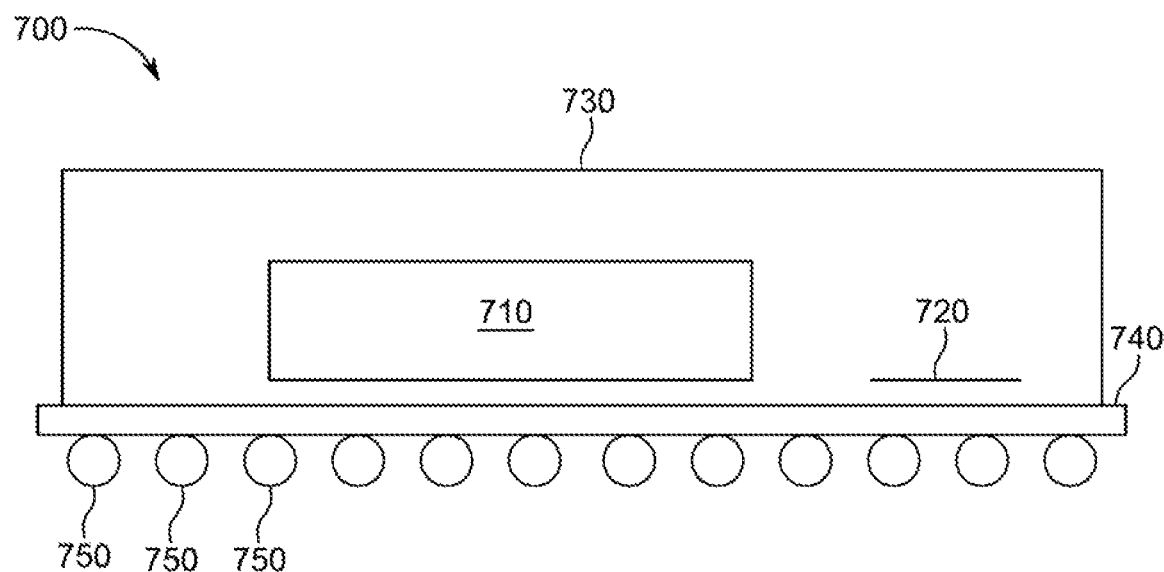
FIGS. 7A and 7B show different illustrative views of a CCU, according to an embodiment.
Figure 7B:
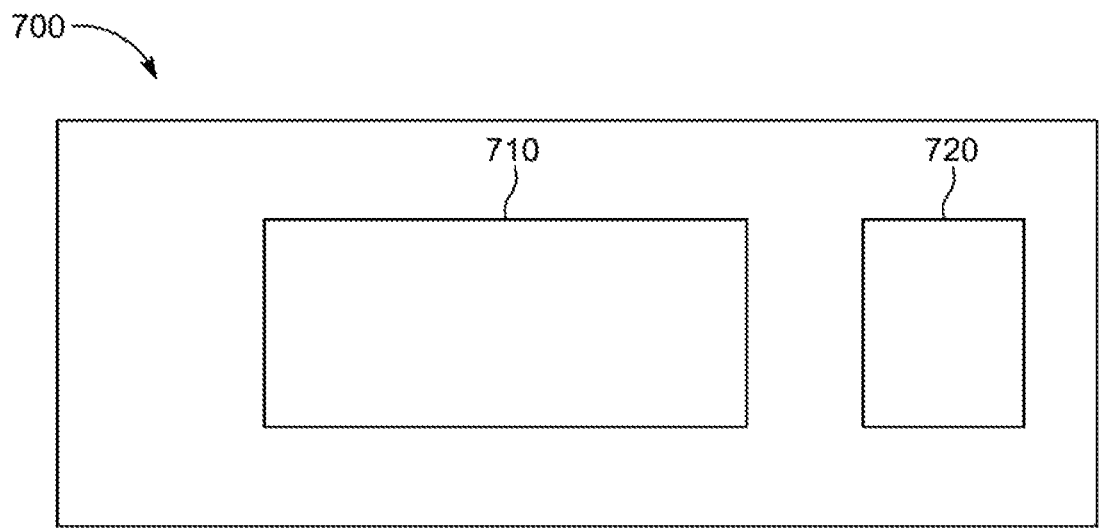

FIGS. 7A and 7B shows different illustrative views of WLFO CCU 700 according to an embodiment. In particular, FIG. 7A shows a cross-sectional view and FIG. 7B shows a top view with encapsulant removed. WLFO CCU 700 can be a type of wafer-level packaging in which packaging of an integrated circuit is still part of the wafer. This is in contrast with conventional methods of slicing the wafer into individual circuits (e.g., die) and then packaging them. An advantage of wafer-level packaging is that the resulting package is practically the same size as the die—thereby providing basis for decreased thickness. In conventional packaging, the wafer is diced, and individual dies are then inserted into a plastic package, and then solder bumps are added to the package. In wafer-level packaging, packaging components and solder bumps are attached to each die on the wafer, and then the wafer is diced. It is common in wafer-level packaging for the interconnects (e.g., solder balls) to fit on the chip—resulting in a fan-in design.

WLFO technology allows the realization of chips with a high number of interconnects. Assembled directly on a silicon wafer, WLFO packages are unconstrained by die size, thereby providing design flexibility to accommodate an unlimited number of interconnects between the package and the application board—resulting in a fan-out design. The package is realized on an artificial wafer, and not a silicon wafer as used in classical wafer level packaging. The artificial wafer is created by embedding pre-diced silicon chips onto a blank carrier (e.g., a blank metal carrier). The blank carrier can include a mold frame that provides interconnects to the each silicon chip. A mold compound can fill in around the mold frame and each chip to provide a reconstituted wafer. After the reconstituted wafer is obtained, ball mounts or pads are added to the electrical connections, and the final package is ready for installation on an application board.

WLFO CCU 700 shows chip 710, transducer 720, mold 730, redistribution layer 740, and solder bumps 750. WLFO CCU 700 can be constructed using the above-described WFLO manufacturing process, however, introduction of transducer 720 to the carrier prior to the molding step enables CCU 700 to have both its chip 710 and transducer 720 into a WLFO package. As shown, both chip 710 and transducer 720 are encapsulated by mold 730 and sit on top of redistribution layer 740. Chip 710 and transducer 720 may be electrically coupled by interconnects existing within mold 730 and/or redistribution layer 740. Mold 730 may be constructed from a material that is transparent to EHF signal energy. In CCU 700, transducer 720 may be positioned adjacent to chip 710, as shown. However, transducers can be placed above or below the chip, as desired.

Figure 7C:
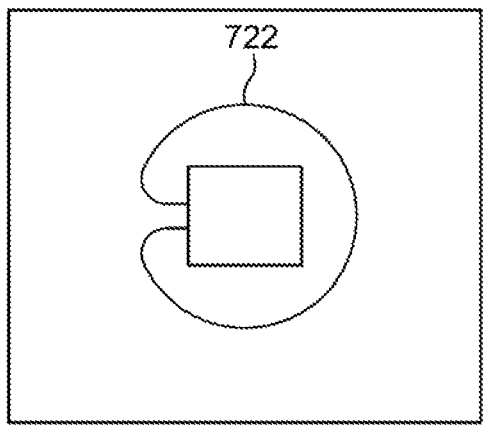
FIGS. 7C-7E show different transducer configurations according to various embodiments.
Figure 7E:
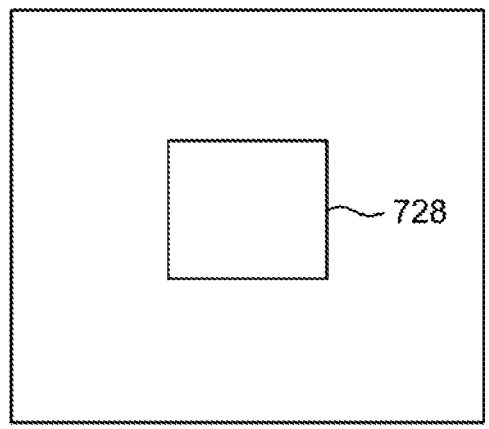
Figure 7D:
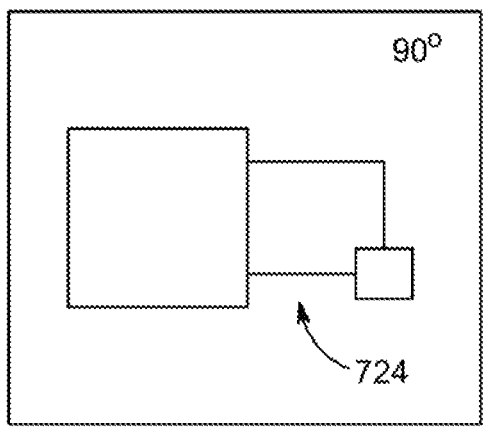

Transducer 720 can take any suitable shape and can be manufactured from different materials. Different shapes may be used to beam shape the EHF signal energy. For example, transducer 720 takes a closed-loop rectangular shape. For example, FIGS. 7C-7E show different transducer configurations. FIG. 7C shows that transducer 722 can take a circular shape. FIG. 7D shows that transducer 724 includes a rectangular element coupled to a straight line element and to a ninety degree bend element. Transducer 724 may transmit EHF energy ninety degrees out of phase. FIG. 7E shows that terminals 726 and 727 exist for being connected to a transducer, but the transducer does not exist.

Figure 7F:
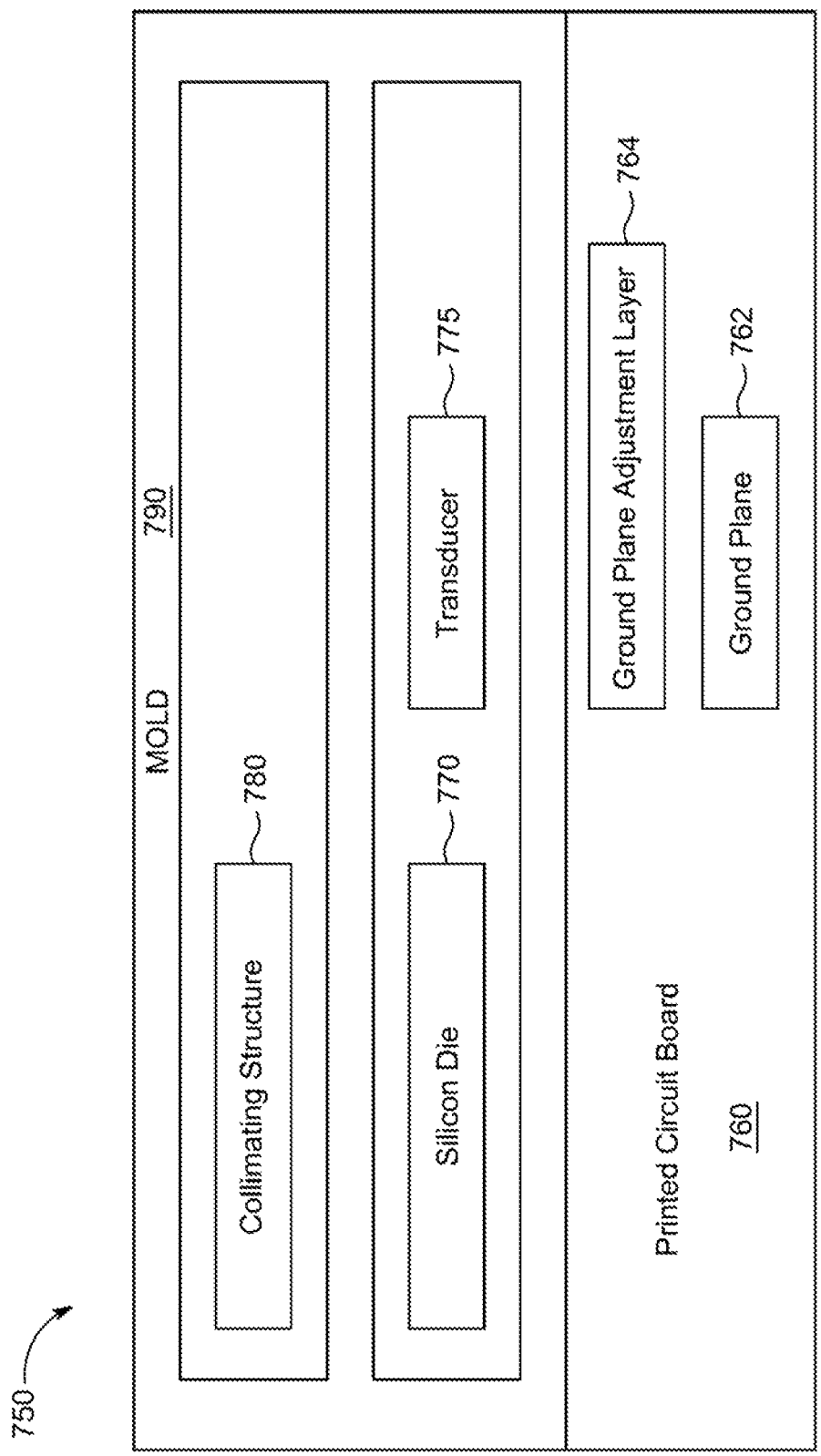
FIG. 7F shows an illustrative block diagram of a CCU package, according to an embodiment.

Referring now to FIG. 7F, a CCU with additional structures is now discussed. FIG. 7F shows an illustrative block diagram WLFO CCU 750 according to an embodiment. In particular, FIG. 7F shows several different components or layers of CCU 750 as simplified block representations thereof. The arrangement of the components or layers is further illustrative of possible relative positioning of components and layers with respect to each other. CCU 750 can include printed circuit board 760, silicon die 770, transducer 775, collimating structure 780, and mold 790. Printed circuit board 760 can include ground plane 762, which can serve as, among other functions, a ground plane for transducer 775. In some embodiments, in order to maximize the radiation effectiveness of transducer 775, the distance between transducer 775 and ground plane 762 should be approximately one fourth of the radiating wavelength W. In other words, the distance can be about $\lambda/4$. The ideal transducer to ground distance can be referred to herein as $D_{T-G(Ideal)}$, whereas the actual physical distance may be referred to herein as $D_{T-G(gross)}$. However, because it is desirable to minimize spacing requirements within electronic devices, the distance between transducer 775 and ground plane 772 may be less than $D_{T-G(Ideal)}$.

Ground plane adjustment layer 764 may be used to effectively increase the transducer to ground distance to a desired net distance (referred to herein as $D_{T-G(effective\ e)}$) even though the actual transducer to ground distance ($D_{T-G(gross)}$) is less than $D_{T-G(Ideal)}$. $D_{T-G(effective)}$) may be approximately the same as $D_{T-G(Ideal)}$. As shown, ground plane adjustment layer 764 may be included as part of printed circuit board 760 and may reside above ground plane 762, but below transducer 775. For example, layer 764 may be one of the layers of printed circuit board 760. In another embodiment (not shown), ground plane adjustment layer 764 may be disposed on top of printed circuit board 760. Ground plane adjustment layer 764 may be a Metamaterial.

Metamaterials are made from assemblies of multiple elements fashioned from composite materials such as metals or plastics. The materials are usually arranged in repeating patterns, at scales that are smaller than the wavelengths of the phenomena they influence. Metamaterials derive their properties not from the properties of the base materials, but from their designed structures and repeatability. Their precise shape, geometry, size, orientation and arrangement give them their ability to manipulate electromagnetic waves by blocking, absorbing, enhancing, or bending waves. Metamaterials that exhibit a negative index of refraction for particular wavelengths and such metamaterials may be used in ground plane adjustment layer 764.

Figure 7G:
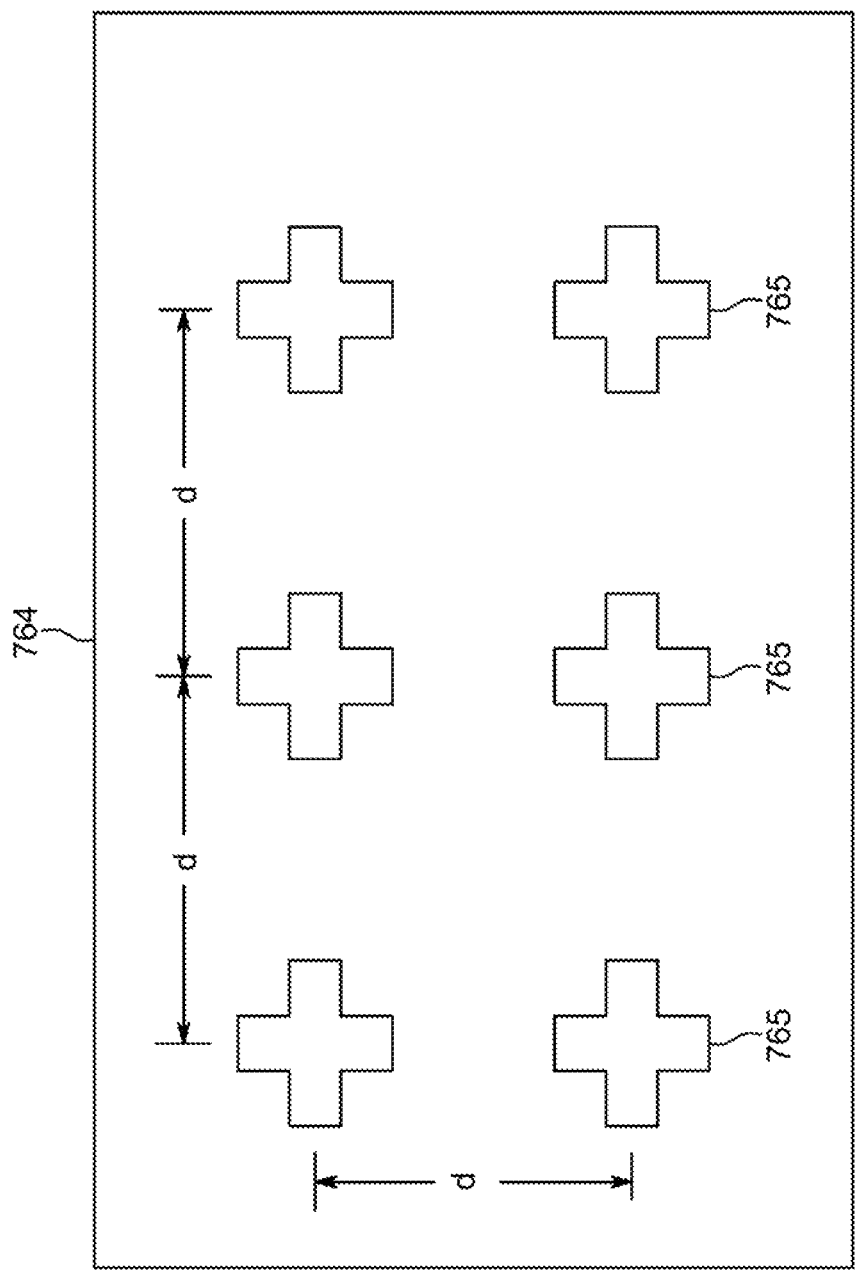
FIG. 7G shows an illustrative ground plane adjustment layer, according to an embodiment.

FIG. 7G shows an illustrative ground plane adjustment layer 764, according to an embodiment. As shown, layer 764 includes a periodic pattern of metallic plus signs 765 evenly distributed throughout, where each plus sign is separated by gap, d. It should be appreciated that the metallic structures in layer 764 are merely illustrative and any suitable number of structures may be used in a periodic pattern. For example, the periodic structures can be circular, rectangular, squiggly, etc.

Referring back to FIG. 7F, transducer 775 may take any suitable shape such as those shown in FIGS. 7D-7F and may be placed adjacent to silicon die 770 on top of printed circuit board 760. In addition, transducer 775 may be positioned such that is above ground plane adjustment layer 764 and ground plane 762. Also shown in FIG. 7F is collimating structure 780, which may be placed above transducer 775 (as shown in FIG. 7F) or above mold 790 (not shown in the FIG.). In yet another embodiment, collimating structure 780 may be integrated within mold 790. Collimating structure 780 may function as a lens that corrects for the phase shift associated with transducer 775. Collimating structure 780 may be constructed from a dielectric material or a combination of different dielectric materials.

Figure 8A:
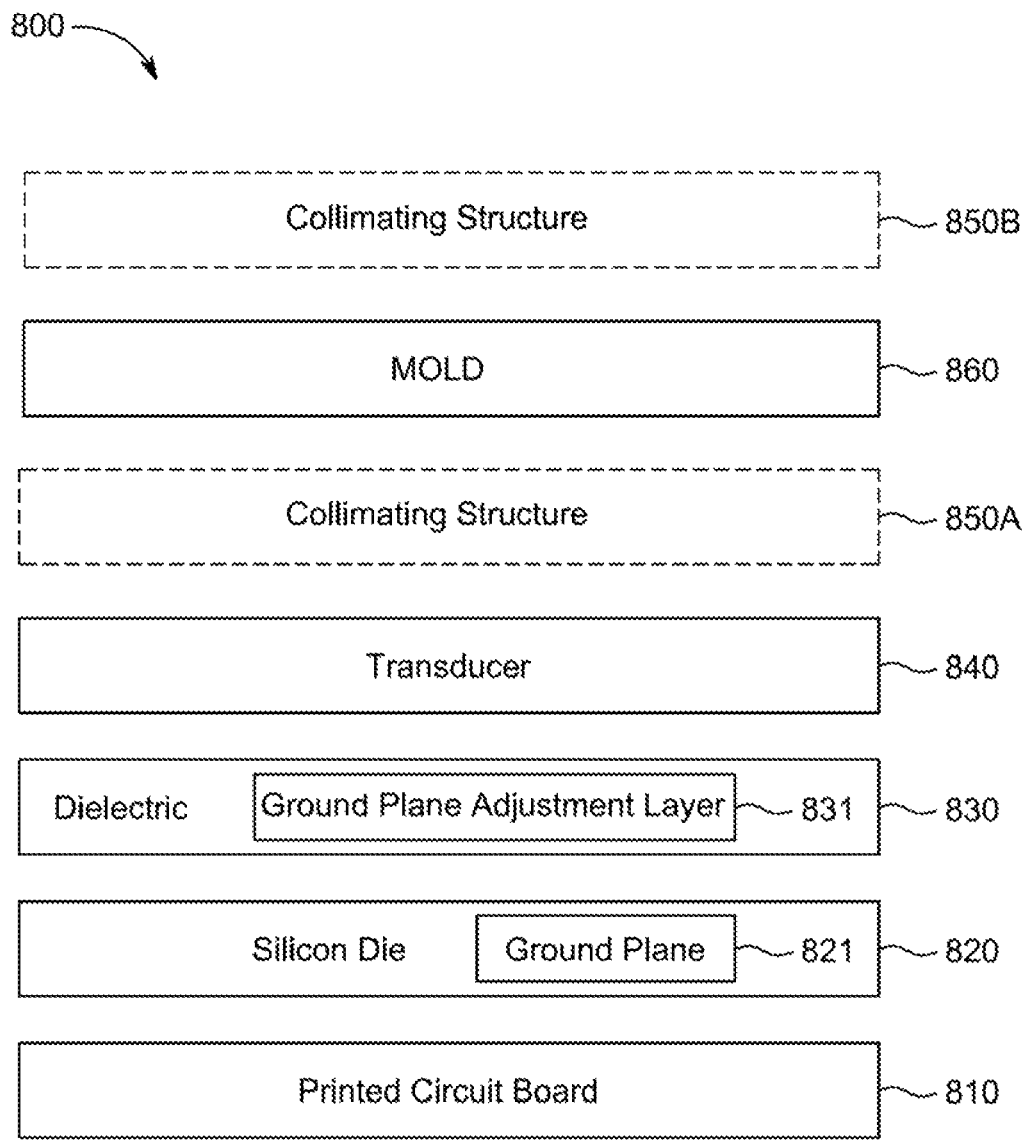
FIG. 8A shows an illustrative block diagram of another CCU package, according to an embodiment.

FIG. 8A shows an illustrative block diagram of CCU 800 according to an embodiment. In particular, FIG. 8A shows several different components or layers of CCU 800 as simplified block representations thereof. The arrangement of the components or layers is further illustrative of possible relative positioning of components and layers with respect to each other. CCU 800 can include printed circuit board 810, silicon die 820, dielectric 830, transducer 840, collimating structure 850A or 850B, and mold 860. Silicon die 820 can include ground plane 821, which may serve as the ground plane for transducer 840. Dielectric 830 may include optional ground plane adjustment layer 831. The stack up of CCU 800 differs than the stack up of CCU 750 primarily in that transducer 840 is disposed on top of silicon die 820 (with dielectric 830 being an intermediate layer) as opposed to CCU 750's approach of having transducer 775 being positioned adjacent to silicon die 770 in the same plane or both located on printed circuit 760. In CCU 880, solder bumps (not shown) can be coupled to printed circuit board 810 or a redistribution layer (not shown). Thus, a "front" side of silicon die 820 is coupled to circuit board 810 or a redistribution layer.

The "back" side of silicon die 820 can be covered by dielectric 830, which has a fixed thickness, and transducer 840 can be placed on top of dielectric 830. In other words, dielectric 830 is placed on the "back" of die 820, and not within die 820. Ground plane adjustment layer 831 may optionally be incorporated within, above, or below dielectric 830 to assist in repositioning the effective ground plane for transducer 840, to improve its radiation efficiency. The above discussion of ground plane adjustment layer 764 applies to layer 831. CCU 800 can be a relatively small package on the order of 1 mm by 1 mm or 2 mm by 2 mm that has a correspondingly low height. Placing the transducer on the back of the chip substantially reduces the area required by the CCU package. In addition, placing the transducer on the back of the chip enables the silicon in the chip to serve as a ground plane for the transducer. A ground plane is useful for preventing unwanted penetration of EHF signal energy and for improving radiation efficiency of transducer 840. Optionally, a conducting ground plane layer can be placed on the back of the die or on an insulating layer that is placed on the back of the die to improve the radiation efficiency and directionality. Metamaterial structures such as those discussed above can be used in conjunction with this ground plane layer to improve radiation efficiency.

Figure 8B:
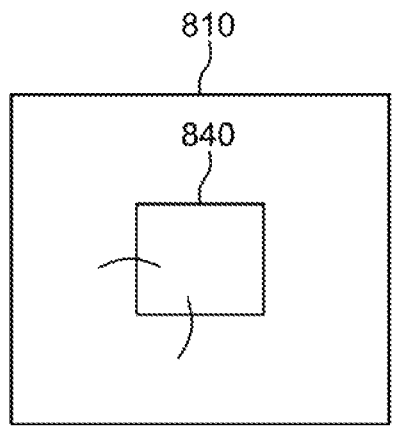
FIGS. 8B-8F and FIG. 8K show different transducer configurations according to various embodiments.
Figure 8E:
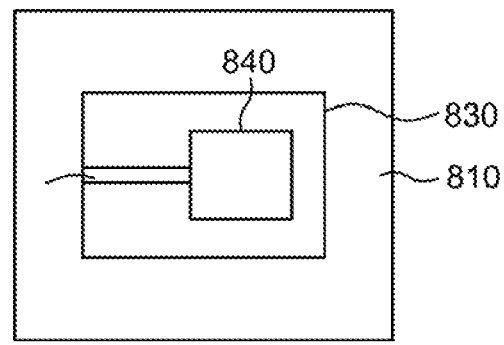
Figure 8C:
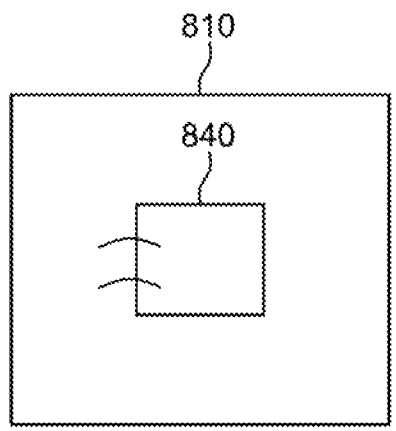
Figure 8F:
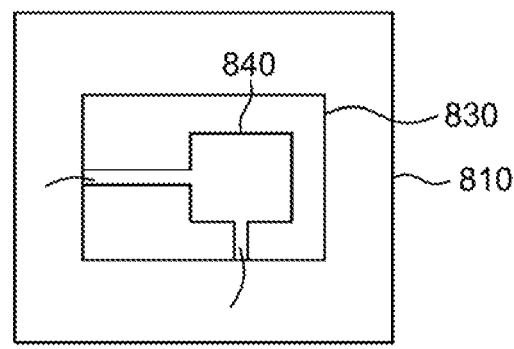
Figure 8D:
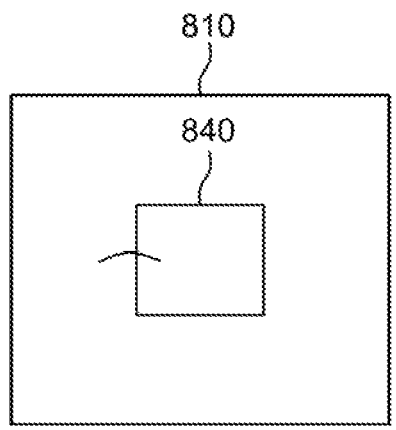
Figure 8K:
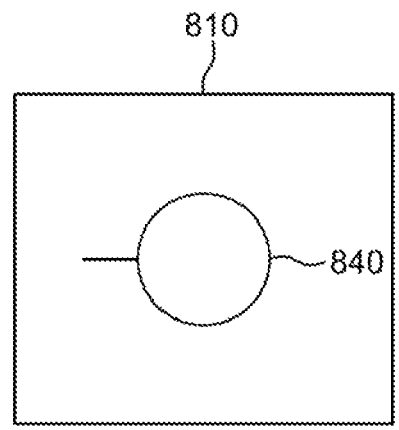

Transducer 840 may be applied as a metal layer on top of dielectric 830. The metal layer may have a fixed thickness. The thickness of both dielectric 830 and the metal layer for transducer 840 may be selected based on desired properties of the transducer. The metal layer of transducer may occupy the entire area of dielectric 830 such that it forms a single continuous layer, such as a patch antenna, that is connected to one or more interconnects (not shown). Examples of such continuous transducers with different interconnects are shown in FIGS. 8B-8D. FIG. 8B shows a patch antenna configured in a circular polarized configuration, and FIGS. 8C and 8D shows different linear polarized configurations. In another embodiment, the metal can be selectively applied to form a desired transducer shape. In yet another embodiment, the metal can be etched to produce the desired transducer shape. FIGS. 8E and 8F show examples of selective shaped transducers that do not occupy all of the surface area of dielectric 830. FIG. 8E shows a linearly polarized transducer and FIG. 8F shows a circularly polarized transducer. It should appreciated that a transducer of any suitable shape and configuration can be constructed to exist on the back of die 820 using conventional techniques.

Collimating structure 850A/B may reside directly on top of transducer 840 (shown as structure 850A), on top of mold 860 (shown as structure 850B), or integrated within mold 860 (not shown). Collimating structure 850A/B may serve as a lens as previously discussed.

Figure 8G:
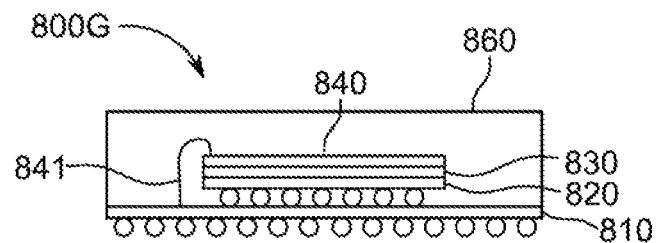
FIGS. 8G-8J show different cross-sectional views of different CCU according to various embodiments.
Figure 8H:
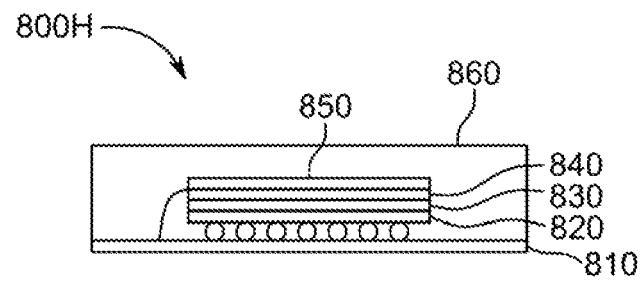
Figure 8I:
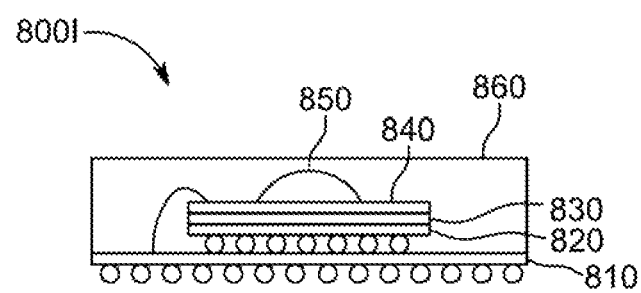
Figure 8J:
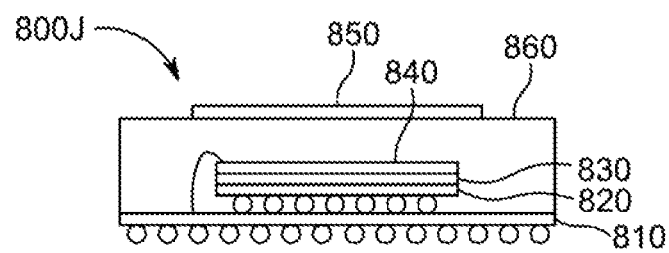

FIGS. 8G-8J shows different cross-sectional views of different CCU 800 embodiments. FIG. 8G shows CCU 800G with printed circuit board 810, die 820, dielectric layer 830, transducer 840, interconnect 841, and mold 860, arranged as shown. An optional additional dielectric layer and/or conductive ground plane may be placed on die 820. Note the lack of a collimating structure. FIG. 8H shows CCU 800H with printed circuit board 810, die 820, dielectric layer 830, transducer 840, interconnect 841, collimating structure 850 and mold 860, arranged as shown. Structure 850 is shown to have a relatively flat shape and is positioned directly on top of transducer 840. FIG. 8I shows CCU 800I with printed circuit board 810, die 820, dielectric layer 830, transducer 840, interconnect 841, collimating structure 850, and mold 860, arranged as shown. Structure 850 is shown to have a curved shape and is positioned directly on top of transducer 840. FIG. 8J shows CCU 800J with printed circuit board 810, die 820, dielectric layer 830, transducer 840, interconnect 841, collimating structure 850, and mold 860, arranged as shown. Structure 850 may be a relatively flat shaped structure positioned on top of mold 860.

Conduit structures that guide EHF signals along a contactless signal pathway existing between coupled pair of CCUs may also be used in combination with contactless board-to-board connector. The conduit structure can include one or more EHF containment channels that define EHF signal pathways through which EHF signal energy is directed. Conduit structures can minimize or eliminate crosstalk among adjacent paths within a device and across devices. Conduit structures can be highly customized for use in each contactless board-to-board connector. That is, because many factors such as spacing (e.g., A spacing in FIG. 2), the number of CCUs, CCU design (and its corresponding beam shaped EHF signal), and material composition of the board and other components may all be known, the conduit structure can be specifically tailored to that particular application of contactless board-to-board connection. Having foreknowledge of the board-to-board connection environment can advantageously enable design and construction of a conduit structure that enhances the performance of the contactless connection. In addition, incorporation of conduit structures in the manufacturing line can be fully automated. For example, a first end of a conduit structure can be fixed to a board or component containing a CCU such that the conduit structure is placed around the CCU, and a second end is exposed and ready to accept insertion of a counterpart CCU contained on another board or component.

Figure 9:
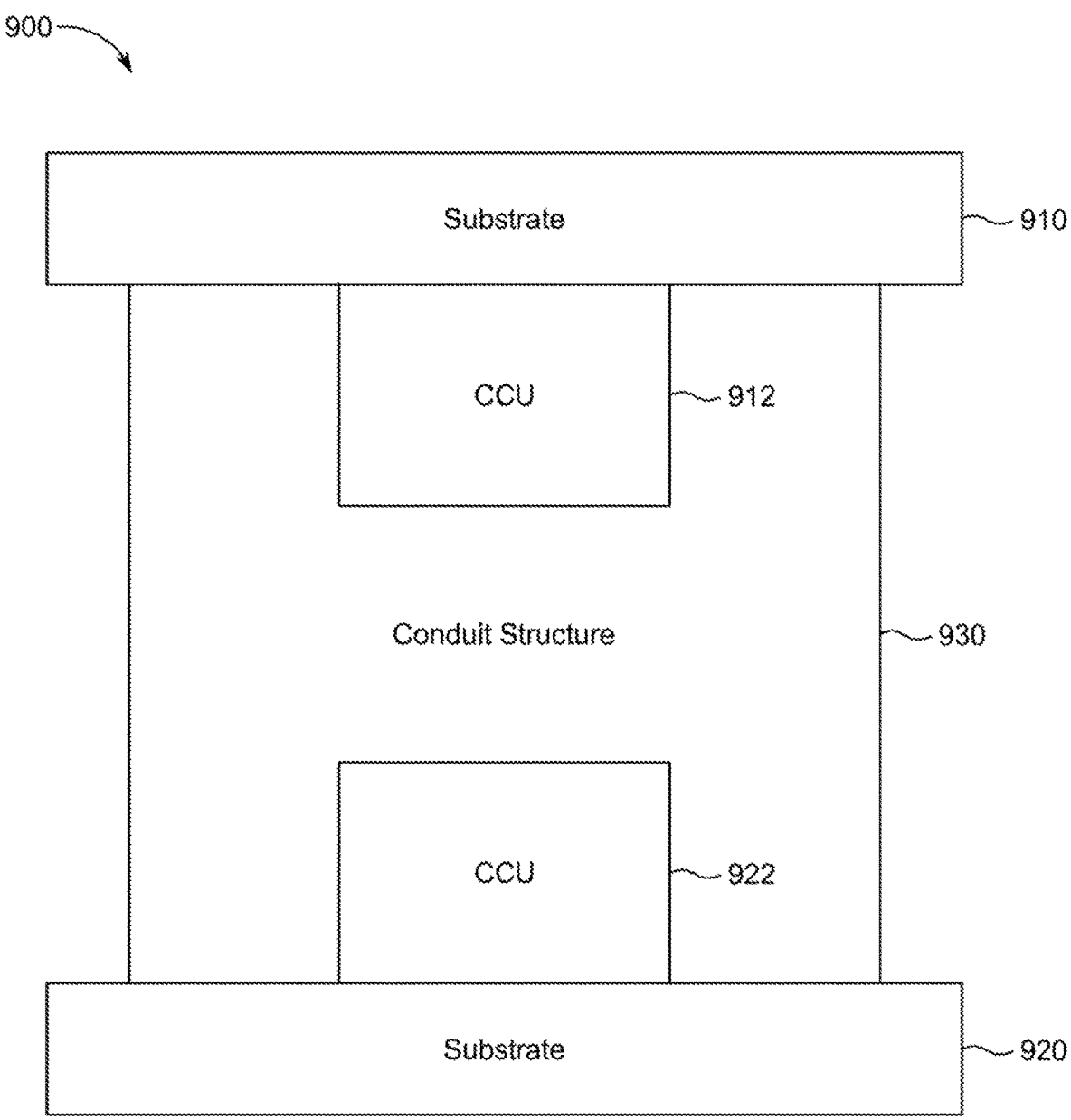
FIG. 9 shows an illustrative schematic view of a contactless board-to-board connector having a conduit structure, according to an embodiment.

FIG. 9 shows an illustrative schematic view of contactless board-to-board connector 900 having a conduit structure according to an embodiment. The conduit structure can be constructed using a variety of different materials and shapes. In some embodiments, the conduit structure can be constructed from an electromagnetic absorbing material, electromagnetic reflective material, electromagnetic transmissive material, or any combination thereof to optimize the coupling between coupled pairs of CCUs and to minimize cross-talk between neighboring CCUs mounted on the same circuit board. If desired, lenses can be placed within the conduit structure to further direct or collimate RF signal energy within a desired pathway. In addition, structures can be incorporated into circuit boards or the circuit board themselves can be constructed from materials that further assist in minimizing cross-talk. For example, holes can be incorporated into a ground plane or electromagnetic absorbers can be positioned between CCUs to minimize cross-talk.

As shown in FIG. 9, connector 900 can include substrate 910, CCU 912, substrate 920, CCU 922, and conduit structure 930. Substrates 910 and 920 can be a circuit board or a component, and CCUs 912 and 922 can embody any suitable package for transmitting and/or receiving contactless signals. In addition, CCU 912 can be mounted to substrate 910, and CCU 922 can be mounted to substrate 920. Conduit structure 930 may be positioned to abut both substrates 910 and 920 and provide a fully contained EHF channel for CCUs 912 and 922. Conduit structure 930 can manage the propagation of EHF signals through a channel (not shown) that exists between CCUs 912 and 922. This channel can prevent EHF radiation fields being emitted from CCUs 912 and 922 from interfering with other CCUs (not shown) that may be in close proximity. The EHF containment channel may exist for each board-to-board connection, and each channel is effectively isolated from other board-to-board connections to prevent cross-talk and signal degradation. Thus, the conduit structure can simultaneously direct EHF signals along desired pathways and prevent the EHF signals from traversing or entering undesired regions. The channel of conduit structures 930 can direct or focus EHF signal energy into a cross sectional area smaller than the transverse dimensions of the EHF CCU's radiation field. As a result, the EHF signals can be focused to travel along a desired signal path and away from undesirable paths.

Conduit structures 930 can be constructed from a combination of different materials to shape the direction of signal propagation and to mitigate EHF leakage (which may cause cross-talk). These materials can include EHF transmissive materials that are operable to facilitate propagation of EHF signals, EHF reflective materials that are operable to reflect EHF signals, and EHF absorptive materials that are operable to absorb EHF signals. Examples of transmissive materials can include plastics and other materials that are electrically non-conductive (i.e., dielectric). Reflective materials can include, for example, metals, metal alloys, metal foam, and other materials that are electrically conductive. Examples of absorptive materials can include, for example, magnetically loaded, rubber materials that are electrically non-conductive, but exhibit effective EHF dampening resonance due to their high permittivity and permeability.

In some embodiments, conduit structure 930 can be constructed from just one of the different material types. For example, the conduit structure can be constructed from just the EHF transmissive material or just the EHF reflective material. In other embodiments, the structure can be constructed from two or more of the different material types. For example, one portion can be constructed from transmissive materials, and another portion can be constructed from reflective materials.

Conduit structure 930 may be constructed to exhibit any suitable shape, and can be constructed from a single component or multiple components. Regardless of shape and construction configuration, each conduit may include at least one signal collimating structure that has a channel existing within the collimating structure. Any suitable shape, including for example, rectangular, elliptical, or polygonal shapes of any suitable dimension may characterize each channel. The collimating structure may be constructed from, lined with, or coated with an EHF reflective material that may simultaneously guide EHF signals along the channel and prevent those same signals from penetrating the channel wall.

In addition to providing one or more pathways for channeling EHF signals, conduit structure 930 may protect the EHF CCUs from shock events. That is, during an event that imparts shock energy to the device, such as a device drop, the conduit structure can absorb the shock to prevent potentially damaging energy transfer to the EHF CCUs. In one embodiment, the shock protection can be achieved by constructing at least a portion of the conduit structure from a relatively rigid material (e.g., plastic) that covers the EHF CCU(s). In another embodiment, shock protection can be achieved using a relatively compliant material (e.g., foam) that also covers the EHF CCU(s). For example, the compliant material can be a metalized foam or a metalized silicon. In yet another embodiment, a combination of relatively rigid and compliant materials may be used to provide protection.

Conduit structure 930 may also be constructed to account for tolerance variations in the board-to-board connection stackup. That is, variations in component construction can vary the stackup tolerances when assembled. For example, the distance between substrates 910 and 920 for any given device may vary depending on construction and variations in components. In one build, the distance may be x and in another build, the distance may be y, where y is greater than x. The conduit structure may include a compliant material that is designed to accommodate variations in stackup. The compliant material may be compressible and thus able to ensure that the conduit structure makes a secure and flush connection with both substrates. Additional details of other conduit structures can be found, for example, in U.S. Publication No. 2017/0040660.

In some embodiments, the conduit structure can serve additional roles above and beyond providing an EHF channel. For example, the conduit structure can serve as a power and/or ground conduit for conveying power and/or ground between boards/components. As another example, the conduit structure can serve as a post member for aligning and maintaining desired gap separation between boards/components. As yet another example, the conduit structure can provide a combination of the EHF channel, power/ground signal conveyance, and post member board/component connections. The conduit structure can also assist with thermal dissipation within the system. For example, the CCUs may have a thermal dissipation path and that thermal path can be improved through PCB design (ground planes, connection to metallic surfaces, and the conduit structures).

Contactless board-to-board connectors may be used to convey signals according to any one of several different types of signal conveyance paradigms. Examples of these signal conveyance paradigms may include D-Phy, ICC, SPI, GPIO, Aux, SMBus, M-PHY, PCIe, USB SuperSpeed, etc. One or more of these signal conveyance paradigms may have several data lines for conveying signals. For example, D-phy may have five lanes. In conventional flex circuit connectors or mechanical interface connectors, the connectors can support the number of lanes required for the signal conveyance paradigm. That is, the conventional connectors can provide a one-to-one correspondence in physical lanes. Such correspondence may not be possible using a contactless connector because there are no actual physical lanes to convey the signals; the contactless connector provides a single lane for conveying data. In accordance with embodiments described herein, the CCU can be packaged with an aggregator that can serialize multiple lanes into a single lane that is connected to the CCU. The aggregator can also deserialize a single lane into multiple lanes.

Figure 10:
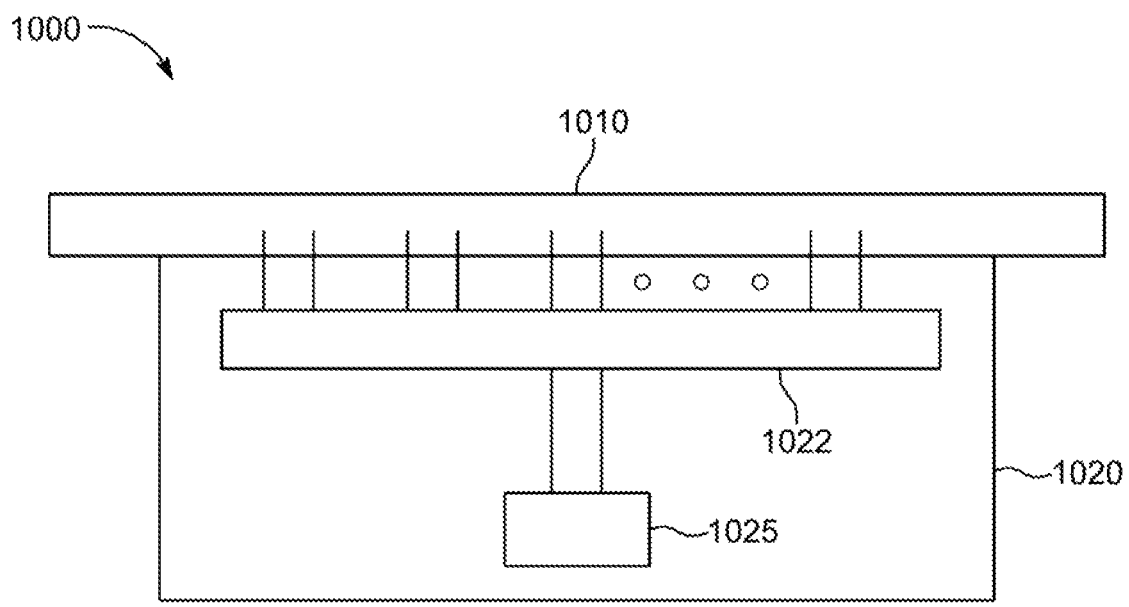
FIG. 10 shows an illustrative contactless board-to-board connector having an aggregator according to an embodiment.
Figure 10:
Figure 10:
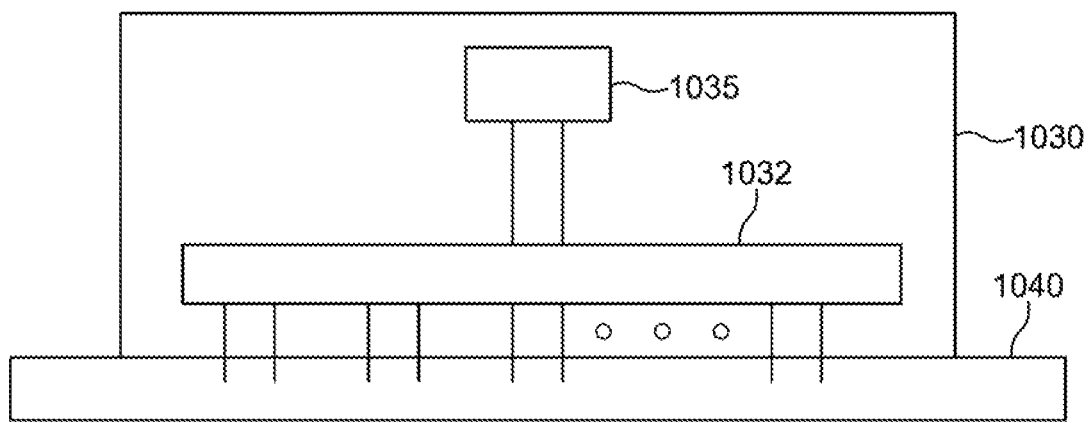

FIG. 10 shows an illustrative contactless board-to-board connector 1000 having an aggregator according to an embodiment. Connector 1000 shows substrate 1010 coupled to connector package 1020, and substrate 1040 coupled to connector package 1030. Connector package 1020 can include aggregator 1022 and CCU 1025. Aggregator 1022 can be connected to any number of signaling lines. As shown, four differential signal lines are shown connected to aggregator 1022. As also shown, a single differential signal line connects aggregator 1022 to CCU 1025. Connector package 1030 can include aggregator 1032 and CCU 1035. Aggregator 1032 can be connected to the same number of differential signal lines as aggregator 1022, and a single differential signal line can connect aggregator 1032 and CCU 1035. Aggregator 1022 and CCU 1025 may exist as a single package, as shown, to minimize board space and reduce Z height. However, it should be understood that aggregator 1022 and CCU may exist as separate packages.

Figure 11:
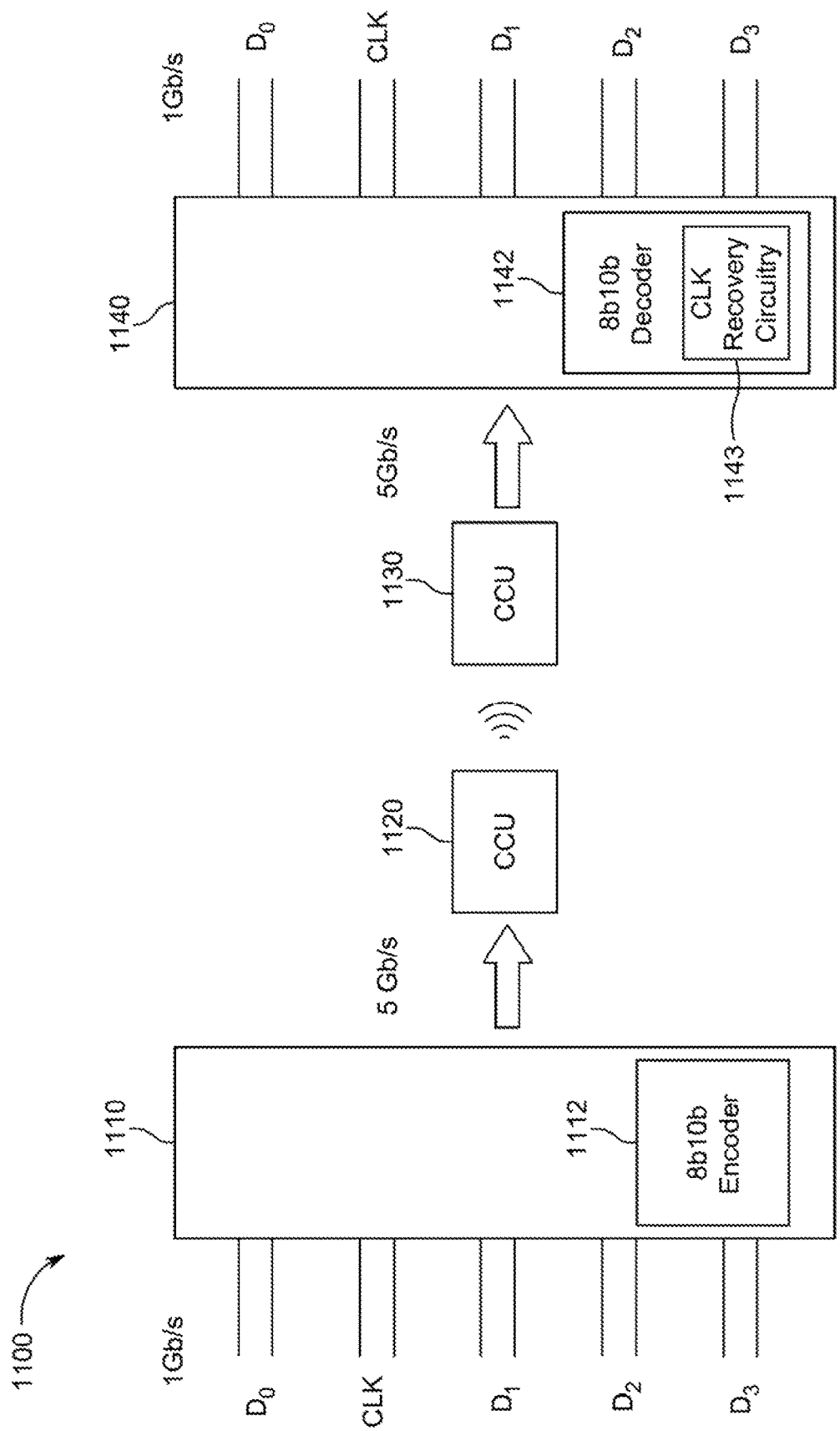
FIG. 11 shows an illustrative schematic diagram of CCU that may be used in a contactless board-to-board connector according to an embodiment.

FIG. 11 shows an illustrative contactless board-to-board connector 1100 having a MIPI D-PHY SERDES (serializer/deserializer) according to an embodiment. Connector 1100 is a specific implementation of connector 1000 of FIG. 10. MIPI D-PHY is a data transport scheme used for conveying information to many components commonly found in electronic devices, including, for example, camera, non-volatile memory, audio circuitry, display, and the like. One side of connector 1100 can include MIPI D-PHY SERDES 1110 and CCU 1120 and the other side of connector 1100 can include CCU 1130 and MIPI SERDES 1140. MIPI SERDES 1110 and 1140 can each have five MIPI D-PHY differential lines operating at a first speed (e.g., 1 GB/s) and one serialized differential line operating at a second speed (e.g., 5 GB/s). The five differential lines can include four data lines (e.g., D0-D3) and one clock line. MIPI SERDES 1110 and 1140 can each include respective 8b10b circuitry 1112 and 1142. For ease of illustration and description, circuity 8b10b is shown as encoder circuitry and circuitry 1142 is shown as decoder circuitry. The serializing/deserializing of the lanes may be mapped one to one, resulting in the serialized line operating at a rate five times faster than the five MIPI D-PHY differential lines. 8b10b circuitry can embed the clock into the serialized line; thus the serialized line provided to CCU 1120 includes an embedded clock. CCU 1120 contactlessly transmits the serialized data to CCU 1130, which provides data over a serialized differential line to MIPI SERDES 1140. Clock recovery circuitry 1143 (which can part of 8b10b circuitry 1142) can recover the clock from the serialized line. The recovered clock is the high speed clock (serial data clock), and clock recover circuitry 1143 can generate the MIPI D-PHY differential clock based on the recovered clock. The MIPI D-PHY differential clock can be used to latch the data out to the data lines and the MIPI D-PHY differential clock on the clock lane.

Figure 12:
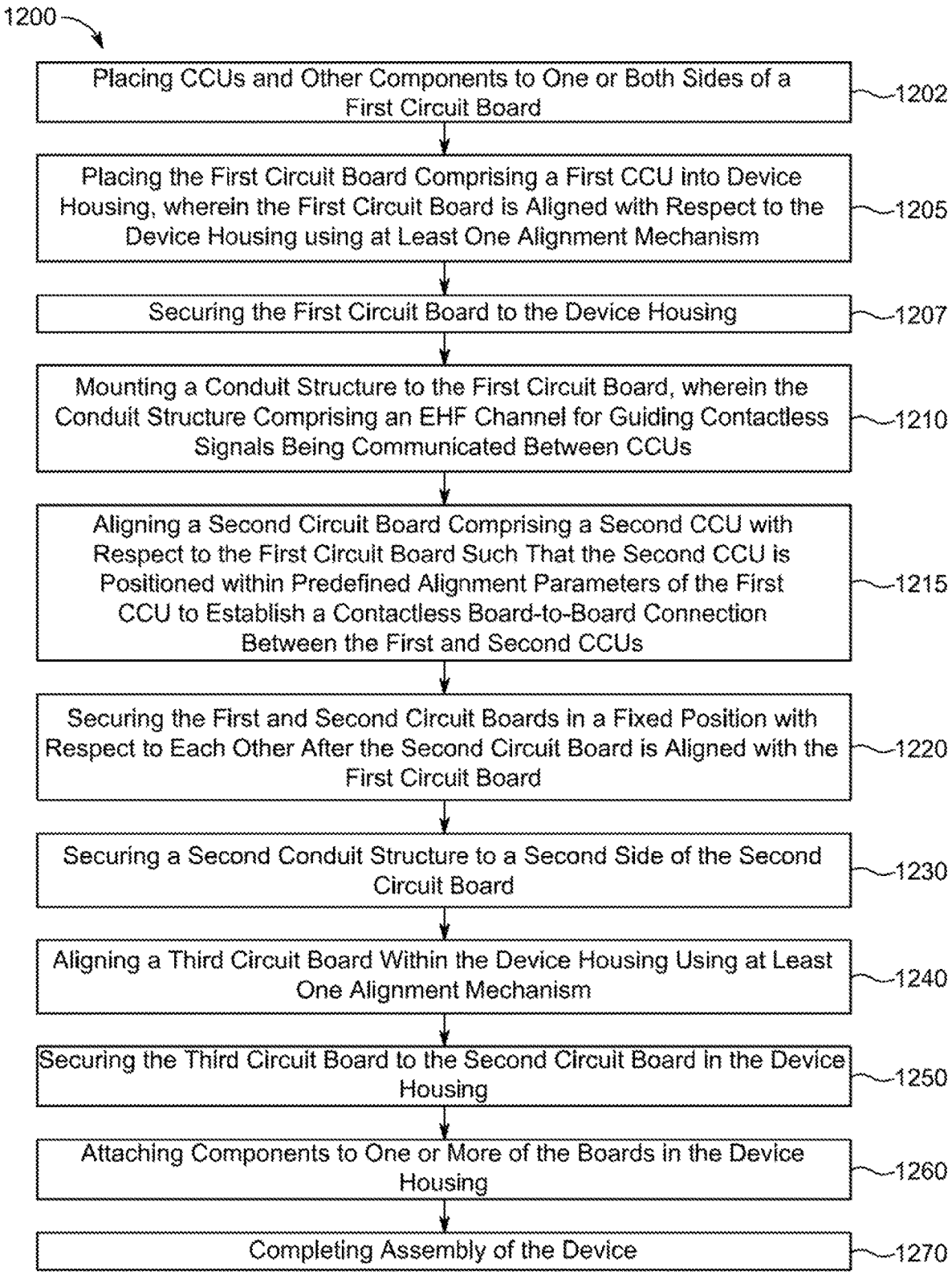
FIG. 12 shows an illustrative process for assembling a contactless board-to-board connection, according to an embodiment.

FIG. 12 shows an illustrative process 1200 for assembling a contactless board-to-board connection within a device, according to an embodiment. Starting at step 1202, CCUs and other components can be placed on one or both sides of a first circuit board. At step 1205, the first circuit board can be placed into an assembly tray, fixture, or device housing (e.g., device housing 350). For example, if the first circuit board is being installed in a device housing, it may be aligned within the housing using alignment posts or other alignment mechanism. At step 1207, the first circuit board can be attached to the housing. For example, the first circuit board can be attached using screws or post members. At step 1210, a conduit structure (e.g., conduit structure 396) can be mounted to the first circuit board (e.g., circuit board 370), wherein the conduit structure includes an EHF channel for guiding contactless signals being communicated between coupled pairs of CCUs. For example, the conduit structure of FIG. 9 may be secured to the first circuit board.

At step 1215, a second circuit board (e.g., circuit board 360) can be aligned with respect to the first circuit board using the alignment mechanism. The second circuit board can include one or more CCUs and components located on one or both sides thereof. The second circuit board can be aligned such that CCUs on a first side of the second board are positioned within predefined alignment parameters of the first board CCUs or device housing to establish a contactless board-to-board connection between the first and second board CCUs. For example, the second circuit board can be aligned using alignment posts such as those shown in FIGS. 3 and 5. In addition, the alignment may ensure that the conduit structure is positioned between and around coupled pairs of CCUs. The predefined alignment parameters can include gap separation between the first and second CCUs and/or co-alignment of contactless signal pathways. At step 1220, the first and second circuit boards can be secured in a fixed position with respect to each other after the second circuit board is aligned with the first circuit board within the device housing.

If desired, in optional step 1230, a second conduit structure (e.g., conduit structure 394) can be secured to a second side of the second circuit board. At optional step 1240, a third circuit board (e.g., circuit board 380) may be aligned within the device housing using at least one alignment mechanism. The third circuit board may have at least one CCU mounted on a first side of the board. When the third circuit board is aligned with the second circuit board, the conduit structure may be coupled to both the second side of the second circuit board and the first side of the third circuit board to thereby provide a dedicated EHF channel for each coupled pair of CCUs. At optional step 1250, the third circuit board can be secured to the device housing or the second circuit board. At optional step 1260, other components may be attached to one or more of the boards or the device housing. At step 1270, assembly of the device can be completed. For example, a second housing may be secured to the device housing to complete assembly of the device. The second housing can be another component such as a backplate that snaps into place with respect to the device housing or that is secured into place using, for example, screws or fasteners. As another example, attachment of the third circuit board may complete assembly of the device.

It should be appreciated that the steps shown in FIG. 12 are merely illustrative and that additional steps may be added, the order of the steps may be rearranged, and some steps may be omitted. For example, a conductor can be secured between both boards to enable power to be conveyed to from one board to another.

Figure 13:
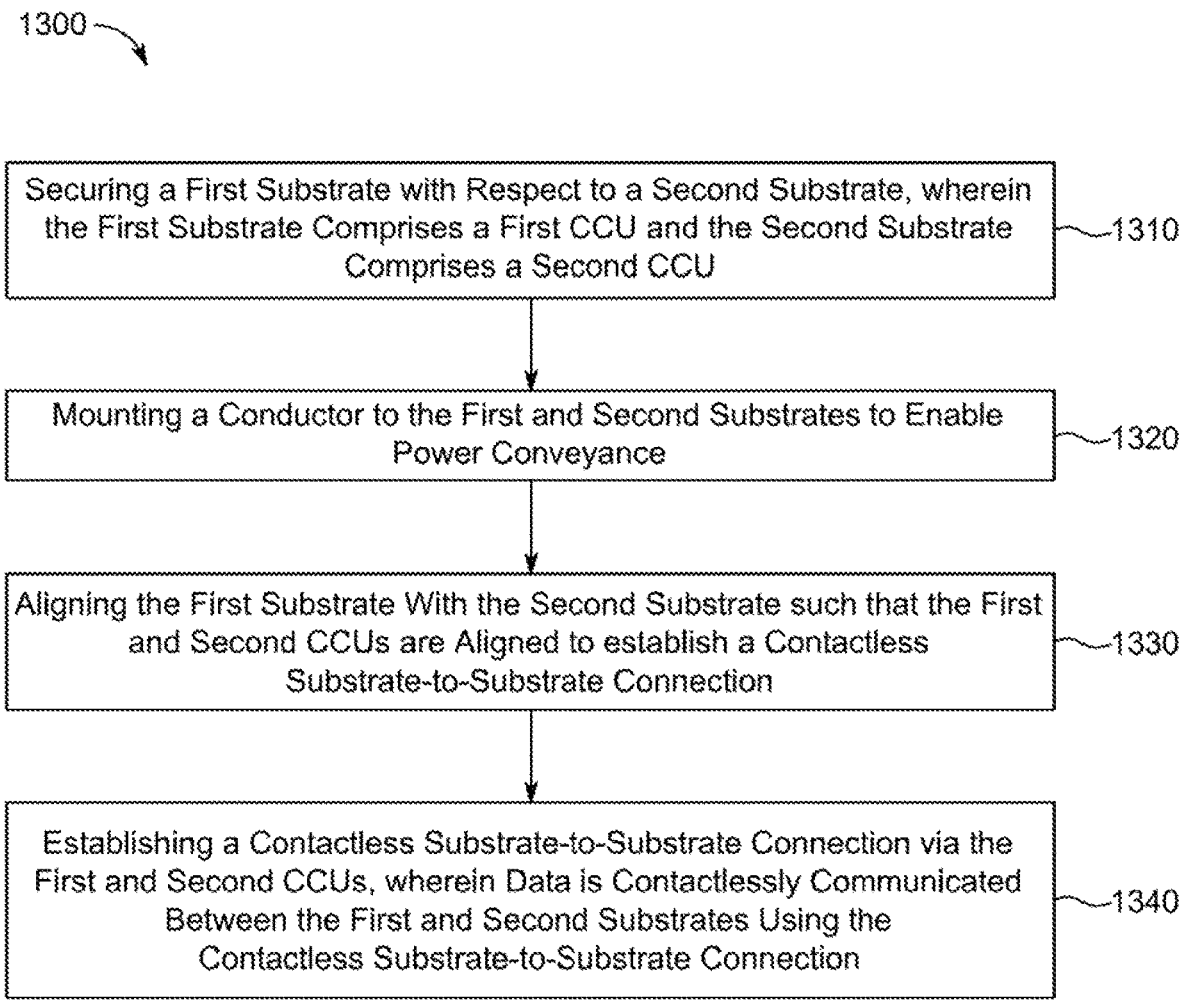
FIG. 13 shows an illustrative flowchart of a process for replacing physical interfacing connectors that convey data in board-to-board or board-to-component connections with contactless connectors, according to an embodiment.

FIG. 13 shows an illustrative flowchart of process 1300 for replacing physical interfacing connectors that convey data in board-to-board or board-to-component connections with contactless connectors. Starting with step 1310, a first substrate can be secured with respect to a second substrate, wherein the first substrate includes a first CCU and the second substrate includes a second CCU. The first substrate can be circuit board or a component, and the second substrate can be circuit board or a component. At step 1320, a conductor can be mounted to the first and second substrates to enable power conveyance. At step 1330, the first substrate can be aligned with the second substrate such that the first and second CCUs are aligned to establish a contactless substrate-to-substrate connection. At step 1340, a contactless substrate-to-substrate connection can be established via the first and second CCUs, wherein data is contactlessly communicated between the first and second substrates using the contactless substrate-to-substrate connection.

It should be appreciated that the steps shown in FIG. 13 are merely illustrative and that additional steps may be added, the order of the steps may be rearranged, and some steps may be omitted.

It is believed that the disclosure set forth herein encompasses multiple distinct inventions with independent utility. While each of these inventions has been disclosed in its preferred form, the specific embodiments thereof as disclosed and illustrated herein are not to be considered in a limiting sense as numerous variations are possible. Each example defines an embodiment disclosed in the foregoing disclosure, but any one example does not necessarily encompass all features or combinations that may be eventually claimed. Where the description recites "a" or "a first" element or the equivalent thereof, such description includes one or more such elements, neither requiring nor excluding two or more such elements. Further, ordinal indicators, such as first, second or third, for identified elements are used to distinguish between the elements, and do not indicate a required or limited number of such elements, and do not indicate a particular position or order of such elements unless otherwise specifically stated.

Moreover, any processes described with respect to FIGS. 2-13, as well as any other aspects of the invention, may each be implemented by software, but may also be implemented in hardware, firmware, or any combination of software, hardware, and firmware. They each may also be embodied as machine- or computer-readable code recorded on a machine- or computer-readable medium. The computer-readable medium may be any data storage device that can store data or instructions which can thereafter be read by a computer system. Examples of the computer-readable medium may include, but are not limited to, read-only memory, random-access memory, flash memory, CD-ROMs, DVDs, magnetic tape, and optical data storage devices. The computer-readable medium can also be distributed over network-coupled computer systems so that the computer readable code is stored and executed in a distributed fashion. For example, the computer-readable medium may be communicated from one electronic subsystem or device to another electronic subsystem or device using any suitable communications protocol. The computer-readable medium may embody computer-readable code, instructions, data structures, program modules, or other data in a modulated data signal, such as a carrier wave or other transport mechanism, and may include any information delivery media. A modulated data signal may be a signal that has one or more of its characteristics set or changed in such a manner as to encode information in the signal.

It is to be understood that any or each module or state machine discussed herein may be provided as a software construct, firmware construct, one or more hardware components, or a combination thereof. For example, any one or more of the state machines or modules may be described in the general context of computer-executable instructions, such as program modules, that may be executed by one or more computers or other devices. Generally, a program module may include one or more routines, programs, objects, components, and/or data structures that may perform one or more particular tasks or that may implement one or more particular abstract data types. It is also to be understood that the number, configuration, functionality, and interconnection of the modules or state machines are merely illustrative, and that the number, configuration, functionality, and interconnection of existing modules may be modified or omitted, additional modules may be added, and the interconnection of certain modules may be altered.

Whereas many alterations and modifications of the present invention will no doubt become apparent to a person of ordinary skill in the art after having read the foregoing description, it is to be understood that the particular embodiments shown and described by way of illustration are in no way intended to be considered limiting. Therefore, reference to the details of the preferred embodiments is not intended to limit their scope.

What is claimed is:

1. A device comprising:
   a first circuit board comprising a first contactless communications unit (CCU) mounted to a first surface of the first circuit board;
   a second circuit board comprising a second CCU mounted to a second surface of the second circuit board, wherein the second circuit board is positioned below the first circuit board such that the first and second surfaces face each other and that a contactless board-to-board connection is established via the first and second CCUs, wherein each of the first and second CCUs comprises:
      a printed circuit board;
      a silicon die having a first side and a second side, wherein the first side is mounted to the printed circuit board;
      a dielectric layer disposed on the second side of the silicon die;
      a transducer disposed on the dielectric layer directly above the second side of the silicon die;
      a ground plane adjustment layer disposed on or within the dielectric layer, wherein the ground plane adjustment layer defines an effective ground plane for the transducer, and wherein the silicon die is an actual ground plane for the transducer and wherein the effective ground plane is different than the actual ground plane; and
      a collimating structure operative as a lens; and
   a conduit structure mounted to the first and second circuit boards, wherein the conduit structure comprises a EHF channel for directing contactless signals being communicated between the first and second CCUs.

2. The device of claim 1, wherein the contactless board-to-board connection enables contactless transmission of data between the first and second CCUs.

3. The device of claim 1, further comprising a plurality of post members that securely couple the first and second circuit boards in a fixed position with respect to each other.

4. The device of claim 3, wherein at least one of the post members comprises a conductor for conveying power between the first and second circuit boards.

5. The device of claim 1, further comprising at least one conductor coupled between the first and second circuit boards.

6. The device of claim 5, wherein the at least one conductor is a leaf spring or a wire.

7. The device of claim 1, wherein the collimating structure is operative to correct for a phase shift associated with the transducer.

8. The device of claim 1, wherein the second circuit board comprises a third CCU, the device further comprising:
   another circuit board comprising a fourth CCU, wherein the third and fourth CCUs form a contactless board-to-component connector for enabling contactless data transfer between the third and fourth CCUs.

9. The device of claim 1, wherein a gap separation between the first and second CCUs is controlled and wherein alignment axes associated with the first and second CCUs are substantially co-aligned.

10. The device of claim 1, wherein each of the first and second CCUs further comprises a mold that encapsulates the silicon die, the transducer, and the collimating structure.

11. The device of claim 1, wherein each of the first and second CCUs further comprises a mold that encapsulates the silicon die and transducer, wherein the collimating structure resides external to the mold.

12. The device of claim 1, wherein a physical distance between the actual ground plane and the transducer is less than one fourth of a radiating wavelength of contactless signals being transmitted or received by the first and second CCUs.

13. The device of claim 12, wherein an effective distance between the actual ground plane and the transducer is approximately one fourth of a radiating wavelength of contactless signals being transmitted or received by the first and second CCUs.

14. A device comprising:
   a first circuit board comprising a first contactless communications unit (CCU) mounted to a first surface of the first circuit board;
   a second circuit board comprising a second CCU mounted to a second surface of the second circuit board, wherein the second circuit board is positioned below the first circuit board such that the first and second surfaces face each other and that a contactless board-to-board connection is established via the first and second CCUs, wherein each of the first and second CCUs comprises:
      a printed circuit board;
      a silicon die having a first side and a second side, wherein the first side is mounted to the printed circuit board;
      a dielectric layer disposed on the second side of the silicon die;
      a transducer disposed on the dielectric layer directly above the second side of the silicon die; and
      a ground plane adjustment layer disposed on or within the dielectric layer, wherein the ground plane adjustment layer defines an effective ground plane for the transducer, and wherein the silicon die is an actual ground plane for the transducer and wherein the effective ground plane is different than the actual ground plane; and
   a conduit structure mounted to the first and second circuit boards, wherein the conduit structure comprises a EHF channel for directing contactless signals being communicated between the first and second CCUs.

15. The device of claim 14, wherein a physical distance between the actual ground plane and the transducer is less than one fourth of a radiating wavelength of contactless signals being transmitted or received by the first and second CCUs.

16. The device of claim 15, wherein an effective distance between the actual ground plane and the transducer is approximately one fourth of a radiating wavelength of contactless signals being transmitted or received by the first and second CCUs.

* * * * *